(12) United States Patent
Choi et al.

(10) Patent No.: US 7,223,693 B2
(45) Date of Patent: May 29, 2007

(54) METHODS FOR FABRICATING MEMORY DEVICES USING SACRIFICIAL LAYERS AND MEMORY DEVICES FABRICATED BY SAME

(75) Inventors: Suk-Hun Choi, Gyeonggi-do (KR); Chang-Ki Hong, Gyeonggi-do (KR); Yoon-Ho Son, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/168,894

(22) Filed: Jun. 28, 2005

(65) Prior Publication Data

US 2005/0250316 A1    Nov. 10, 2005

Related U.S. Application Data

(63) Continuation-in-part of application No. 10/999,103, filed on Nov. 29, 2004, and a continuation-in-part of application No. 10/873,388, filed on Jun. 22, 2004.

(30) Foreign Application Priority Data

Dec. 12, 2003  (KR) ............... 2003-90874
Apr. 1, 2004   (KR) ............... 2004-22720
Jul. 19, 2004  (KR) ............... 2004-56125

(51) Int. Cl.
    *H01L 21/00* (2006.01)
(52) U.S. Cl. ............ 438/672; 438/675; 257/71; 257/E21.649; 257/E27.084
(58) Field of Classification Search .......... 438/682, 438/675; 257/E27.084, E21.649, 71
See application file for complete search history.

(56) References Cited

U.S. PATENT DOCUMENTS 3,877,049 A * 4/1975 Buckley .................. 257/4

(Continued)

FOREIGN PATENT DOCUMENTS

JP          63272037 A  * 11/1988

(Continued)

OTHER PUBLICATIONS

Park et al, Study of Over-Polishing at the Edge of a Pattern in Selective CMP, Sixth International Symposium on Chemical Mechanical Polishing, 204th Meeting of the Electrochemical Society, Inc., Oct. 12-16, 2003, 8 pages.

(Continued)

*Primary Examiner*—Michelle Estrada
*Assistant Examiner*—Nicholas J. Tobergte
(74) *Attorney, Agent, or Firm*—Myers Bigel Sibley & Sajovec PA

(57) ABSTRACT

Methods are provided for fabricating contacts in integrated circuit devices, such as phase-change memories. A protection layer and a sacrificial layer are sequentially formed on a semiconductor substrate. A contact hole is formed through the sacrificial layer and the protection layer. A conductive layer is formed on the sacrificial layer and in the contact hole, and portions of the conductive layer and the sacrificial layer are removed to expose the protection layer and form a conductive plug protruding from the protection layer. A protruding portion of the conductive plug removed to leave a contact plug in the protection layer. A phase-change data storage element may be formed on the contact plug.

43 Claims, 19 Drawing Sheets

U.S. PATENT DOCUMENTS

| | | | |
|---|---|---|---|
| 5,244,534 A * | 9/1993 | Yu et al. | 438/672 |
| 5,440,167 A | 8/1995 | Iranmanesh | |
| 5,776,833 A * | 7/1998 | Chen et al. | 438/672 |
| 5,789,758 A * | 8/1998 | Reinberg | 257/3 |
| 6,147,395 A | 11/2000 | Gilgen | |
| 6,274,485 B1 * | 8/2001 | Chen et al. | 438/652 |
| 6,833,331 B2 * | 12/2004 | Saito et al. | 438/789 |

FOREIGN PATENT DOCUMENTS

JP  2003-174144  6/2003

OTHER PUBLICATIONS

Hwang, et al, "Completely CMOS-Compatible Phase-Change Non-volatile RAM Using NMOS Cell Transistors," Non-Volatile Semiconductor Memory Workshop, Feb. 2003, pp. 91-92.

Hwang et al, "Phase Change Chalcogenide Nonvolatile RAM Completely Based on CMOS Technology," VLSI Symposium, Jun. 2003, 3 pages.

Park et al., "Study of Over-polishing at the Edge of a Pattern in Selective CMP," Abs. 930, 204th Meeting of the Electrochemical Society, Inc., Oct. 12-16, 2003, 1 page.

* cited by examiner

METHODS FOR FABRICATING MEMORY DEVICES USING SACRIFICIAL LAYERS AND MEMORY DEVICES FABRICATED BY SAME

CROSS-REFERENCE TO RELATED APPLICATION

The present application is a continuation-in-part of U.S. patent application Ser. Nos. 10/873,388 and 10/999,103, filed Jun. 22, 2004 and Nov. 29, 2004, respectively, which claim the priority of Korean Patent Application Nos. 2003-90874 and 2004-22720, filed Dec. 12, 2003 and Apr. 1, 2004, respectively, in the Korean Intellectual Property Office. The present application also claims the priority of Korean Patent Application No. 2004-56125, filed Jul. 19, 2004 in the Korean Intellectual Property Office. The disclosures of all of the above-referenced applications are incorporated herein by reference in their entireties.

BACKGROUND OF THE INVENTION

The present invention relates to integrated circuits and fabrication techniques therefor, and more particularly, to memory devices and methods of fabrication therefor.

Factors, such as an ongoing desire for increased circuit integration and the development of new device configurations (e.g., new memory cell types) that are scaleable to extremely small dimensions, have led to an increasing need for techniques for fabricating very small features in integrated circuit devices. Lower bounds on feature size often arise from constraints of photolithography, i.e., the resolution to which layers can be patterned and properly aligned may constrain the size of features that can be fabricated. Techniques, such as the use of sidewall spacers to reduce patterned dimensions of objects like holes in material layers and the use of creative etching techniques, have been developed to lessen some of these constraints, but other barriers to reliably and repeatably forming small structures still remain.

Damascene processes are commonly used in integrated circuit processing to form features such as contacts and wiring patterns. For example, in a typical conventional damascene process, a silicon dioxide layer is formed on a microelectronic substrate. A groove (for wiring) and/or an opening to an underlying region (for a contact) is formed in the dielectric layer. A conductive layer (e.g., a metal containing layer) is then deposited on the dielectric layer, filling the groove and/or opening. Chemical mechanical polishing (CMP) may then be used to remove portions of the conductive layer disposed on the dielectric layer, thus leaving a wiring pattern in the groove and/or a contact plug in the opening.

Such techniques may be used, for example, in fabricating a lower electrode contact (or "small contact") that provides a high current density path for heating a phase-changeable material (e.g., chalcogenide) region in a phase-change memory device. In a typical fabrication process for such a cell, a dielectric layer is formed over a conductive plug or pad that is electrically coupled to a source/drain region of an access transistor formed on a semiconductor substrate, and a small contact hole is made in the dielectric layer to expose an upper surface of the plug or pad. A metal-containing material is then deposited on the dielectric layer and in the small contact hole. Excess material disposed on the dielectric layer is then removed using CMP to leave a small contact plug in the contact hole. A phase-changeable material region is then formed on the surface of the dielectric layer and the small contact plug, and an upper electrode is formed on the phase-changeable material region. Examples of techniques for forming contacts for phase-change memory devices are described in U.S. Pat. No. 6,117,720 and U.S. Pat. No. 6,147,395.

Conventional processes may have characteristics that can limit the ability to reliably and repeatably make small contacts or other small structures. In particular, in many applications, it may be desirable to remove a metal or other conductive layer as close as possible to the top of a surrounding dielectric layer or region. For example, in forming small contact plugs for phase-change memory cells along the lines described above, it is generally desirable to remove the metal layer down to a shoulder of the opening in the dielectric layer so that the surface area of the individual contact plugs is made as small as possible while maintaining the planarity of the substrate surface and uniformity among the contact plugs. However, using a conventional process as described above can result in less than desirable results due to flaring at the mouths of the contact holes and/or dishing, overerosion, edge over-erosion, and other surface non-uniformity arising from the CMP. Such effects may be exacerbated by variation in pattern density across the surface of the wafer.

SUMMARY OF THE INVENTION

In some embodiments of the present invention, methods of fabricating a contact are provided. A protection layer and a sacrificial layer are sequentially formed on a semiconductor substrate. A contact hole is formed through the sacrificial layer and the protection layer. A conductive layer is formed on the sacrificial layer and in the contact hole, and portions of the conductive layer and the sacrificial layer are removed to expose the protection layer and form a conductive plug protruding from the protection layer. A protruding portion of the conductive plug removed to leave a contact plug in the protection layer. The protection layer may include an insulating layer having an etch selectivity with respect to the sacrificial layer. For example, the protection layer may include a silicon nitride layer and/or a silicon oxynitride layer, and the sacrificial layer may include a silicon oxide layer.

In certain embodiments, forming a contact hole includes forming a photoresist pattern on the sacrificial layer, the photoresist pattern having an opening therein that exposes a portion of the sacrificial layer. The photoresist pattern is flowed to slope sidewalls of the photoresist pattern in the opening such that an upper portion of the opening is wider than a lower portion of the opening. The sacrificial layer and the protection layer are etched using the flowed photoresist pattern as an etch mask to form a hole through the sacrificial layer and the protection layer. After removing the flowed photoresist pattern, multiple sidewall spacers may be formed on sidewalls of the sacrificial layer and the protection layer in the hole. The multiple sidewall spacers may include an insulating layer formed without using an oxidation gas. Formation of the multiple sidewall spacers may include forming the multiple sidewall spacers from a silicon nitride layer, a silicon oxynitride layer, a silicon oxide layer, and/or a metal oxide layer. For example, a silicon oxynitride layer and a silicon nitride layer may be formed on the sidewalls of the sacrificial layer and the protection layer.

In yet further embodiments of the present invention, forming a contact hole includes forming a photoresist pattern on the sacrificial layer, the photoresist pattern having an opening therein that exposes a portion of the sacrificial layer. The sacrificial layer and the protection layer are etched using the photoresist pattern as an etch mask to form a hole through the sacrificial layer and the protection layer. The photoresist pattern is removed, and multiple sidewall spacers are formed on sidewalls of the sacrificial layer and the protection layer in the hole.

In further embodiments of the present invention, methods of fabricating phase-change memory devices are provided. A protection layer and a sacrificial layer are sequentially formed on a semiconductor substrate, the sacrificial layer having an etch selectivity with respect to the protection layer. A contact hole is formed through the sacrificial layer and the protection layer. A conductive layer is formed on the sacrificial layer and in the contact hole. Portions of the conductive layer and the sacrificial layer are removed to expose the protection layer and form a conductive plug that protrudes from the protection layer. A protruding portion of the conductive plug is removed to leave a contact plug in the protection layer. A phase-change data storage element is formed on the contact plug.

Before forming the protection layer, a MOS access transistor may be formed in the semiconductor substrate. The MOS access transistor includes spaced apart source and drain regions, a channel region disposed between the source and drain regions, and a gate electrode on the channel region. A lower interlayer insulating layer may be formed on the MOS access transistor. Contact pads electrically connected to the source region may be formed in the lower interlayer insulating layer. The protection layer may be formed on the contact pads and the lower interlayer insulating layer, and the contact hole may expose one of the contact pads.

Forming a phase-change data storage element may include forming a phase-change material layer on the contact plug, and patterning the phase-change material layer to form a phase-change material pattern contacting the contact plug. The phase-change material layer may include a chalcogenide layer, e.g., a compound layer containing germanium, stibium, and tellurium. In further embodiments, forming a data storage element includes sequentially forming a phase-change material layer and an upper electrode layer on the contact plug, and patterning the upper electrode layer and the phase-change material layer to form a phase-change material pattern contacting the contact plugs and an upper electrode on the phase-change material pattern. The phase-change material layer may include a chalcogenide layer, and the upper electrode layer may include a titanium nitride layer. An upper interlayer insulating layer may be formed on the data storage element, and a plate line electrically connected to the data storage element may be formed on the upper insulating layer.

DETAILED DESCRIPTION OF EXEMPLARY EMBODIMENTS

Figure 1:
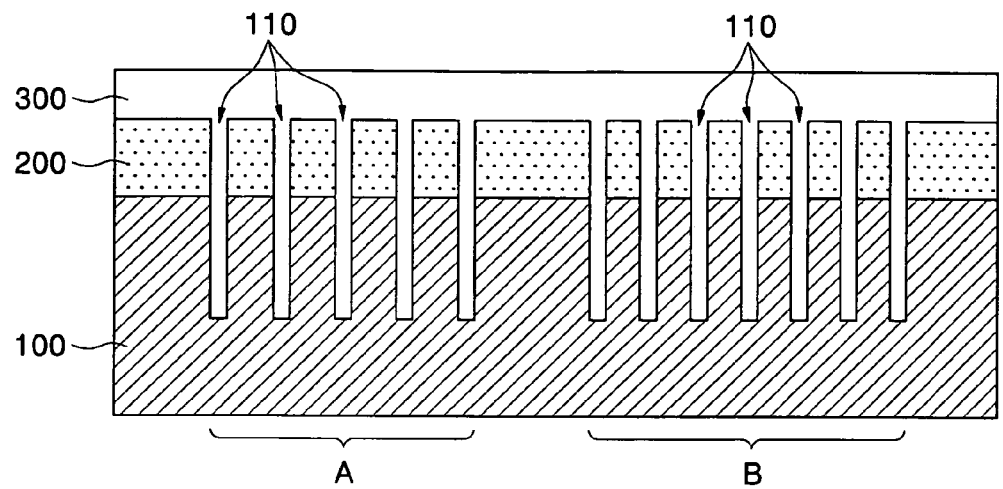
FIGS. 1–4 are cross-sectional views illustrating exemplary operations of a multi-CMP process for forming structures in a dielectric layer according to some embodiments of the present invention.

The present invention now will be described more fully hereinafter with reference to the accompanying drawings, in which typical and exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath," may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as "below" other elements would then be oriented "above" the other elements. The exemplary term "below," therefore, encompasses both an orientation of above and below.

It will be understood that although the terms "first" and "second" are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. As used herein the term "and/or" includes any and all combinations of one or more of the associated listed items. Like numbers refer to like elements throughout.

FIGS. 1–4 illustrate exemplary operations for forming conductive structures, such as wiring and/or contacts, in a microelectronic substrate according to some embodiments of the present invention. Referring to FIG. 1, a dielectric layer 100 and a sacrificial layer 200 are formed on a substrate (not shown), and openings 110 formed therein in low density and high density pattern regions A, B. The sacrificial layer 200 includes a material that exhibits an etching selectivity with respect to the dielectric layer 100 in a subsequent etching process described below. For example, the dielectric layer 100 may include silicon nitride and/or silicon oxynitride, and the sacrificial layer may include silicon dioxide. It will be appreciated that the layers 100, 200 may be single layers or compound layers including multiple layers. The openings 110 may be formed using any of a number of different conventional techniques, such as by etching using a photolithographic mask. It will be understood that the openings formed in the layers 100, 200 may extend only partially into the dielectric layer 100, as might be the case in forming a wiring pattern, for example, and/or may extend through the dielectric layer 100 (as shown in dashed line) to expose an underlying structure, as might be the case in forming a contact for that underlying structure.

As further shown in FIG. 1, a conductive layer 300 is formed on the sacrificial layer 100, filling the openings 110. In general, the conductive layer 300 may include any of a number of different materials, including, but not limited to, metals, such as aluminum, titanium, copper, and tungsten, and/or metal-containing materials, such as metal silicides or metal nitrides, and/or non-metallic conductors, such as polysilicon. The conductive layer 300 may comprise a single layer or compound layers including, for example, ohmic transition layers, glue layers, contamination barrier layers, spacers, and the like.

Figure 2:
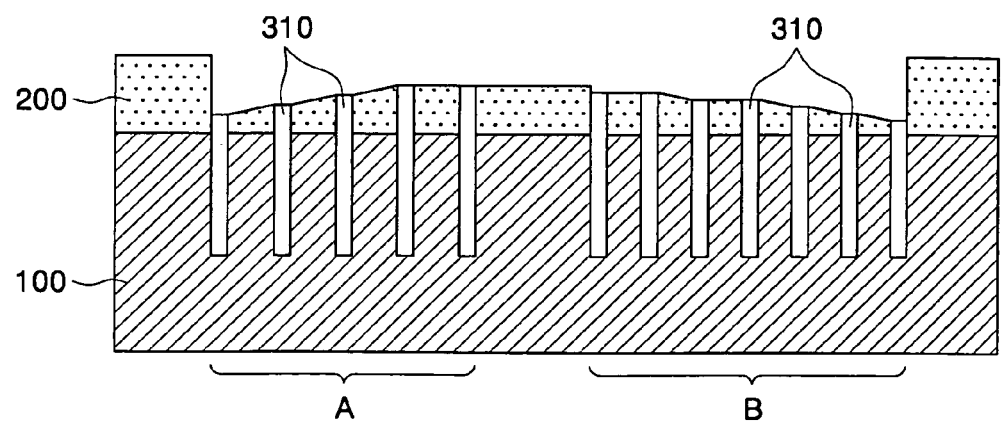

Referring to FIG. 2, a first CMP is performed to remove portions of the metal-containing layer 300 on the sacrificial layer 200 and leave conductive regions 310 in the sacrificial layer 200 and the dielectric layer 100. As shown, the CMP may erode portions of the sacrificial layer 200, and the conductive regions 310 may be significantly non-uniform in extent.

Figure 3:
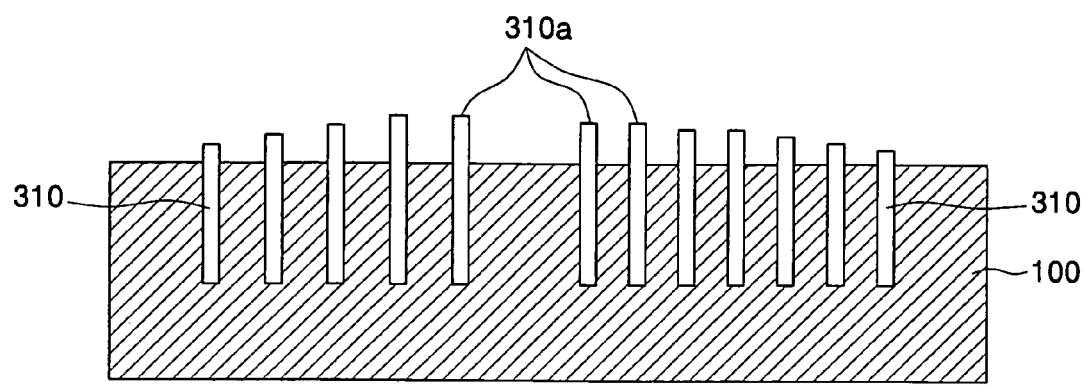

Referring to FIG. 3, the sacrificial layer 200 is etched (e.g., dry or wet etched) away to expose the dielectric layer 100, leaving portions 310a of the conductive regions 310 protruding from the dielectric layer. An ashing process using an oxygen plasma and subsequent cleaning using, for example, a dilute HF solution, may be performed after this etching to remove polymer residues that may remain on the dielectric layer 100. Such residues may have their source in particles left on the substrate by polymer polishing pads used in the preceding CMP.

Figure 4:
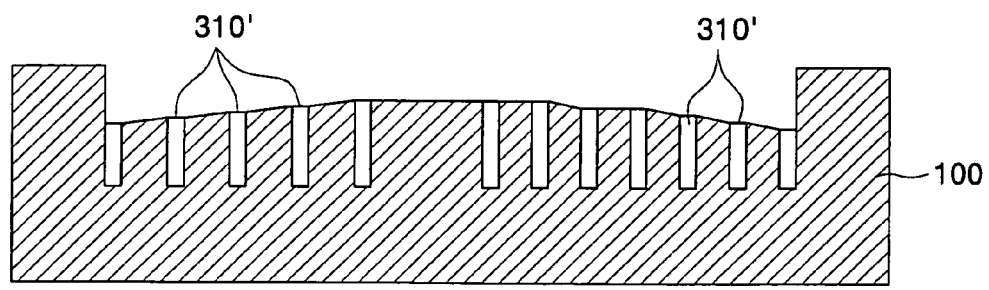

Referring to FIG. 4, a second CMP is performed to remove the protruding portions 310a of the conductive regions 310, leaving reduced-size conductive regions 310' in the dielectric layer 100. As shown, some erosion of the dielectric layer 100 and non-uniformity in the conductive regions 310' may occur as a result of this second CMP. However, it is believed that, because the second CMP process can be highly selective of the exposed protruding portions 310a of the conductive regions 310, the degree of erosion of dielectric layer 100 can be limited to an acceptable level. Accordingly, the size of the conductive regions 310' may be more uniform using the above-described process, which includes two CMP processes and an intervening etching process, in comparison to a conventional single-CMP approach. To prepare the resulting structure for further fabrication operations, for example, formation of one or more chalcogenide regions on the conductive regions 310' as would be done in fabricating a phase-change memory device, polymer residues may be removed by an oxygen plasma ashing process and a subsequent cleaning using, for example, an HF solution.

FIGS. 5–12 illustrate additional aspects of the present invention, showing how a multiple-CMP process with intermediate etching of a sacrificial layer along the lines described above may be particularly advantageous in forming a very small structure, such as a small contact for a phase-change memory device, and how use of a sacrificial layer, such as a sacrificial layer used in the multi-CMP procedure described, can allow a desirably narrow contact to be formed. In particular, FIGS. 5-12 illustrate a phase-change memory device and fabrication operations therefor that include two CMP operations with an intermediate etching operation along the lines described above according to further embodiments of the present invention. It will be appreciated that, although the fabrication operations and structures formed thereby illustrated in FIGS. 5–12 illustrate how a fabrication process such as that described above with reference to FIGS. 1–4 may be particularly advantageous for forming a phase-change memory device, the embodiments of FIGS. 5–12 are provided for purposes of illustration, and the present invention is not limited to such embodiments.

Figure 5:
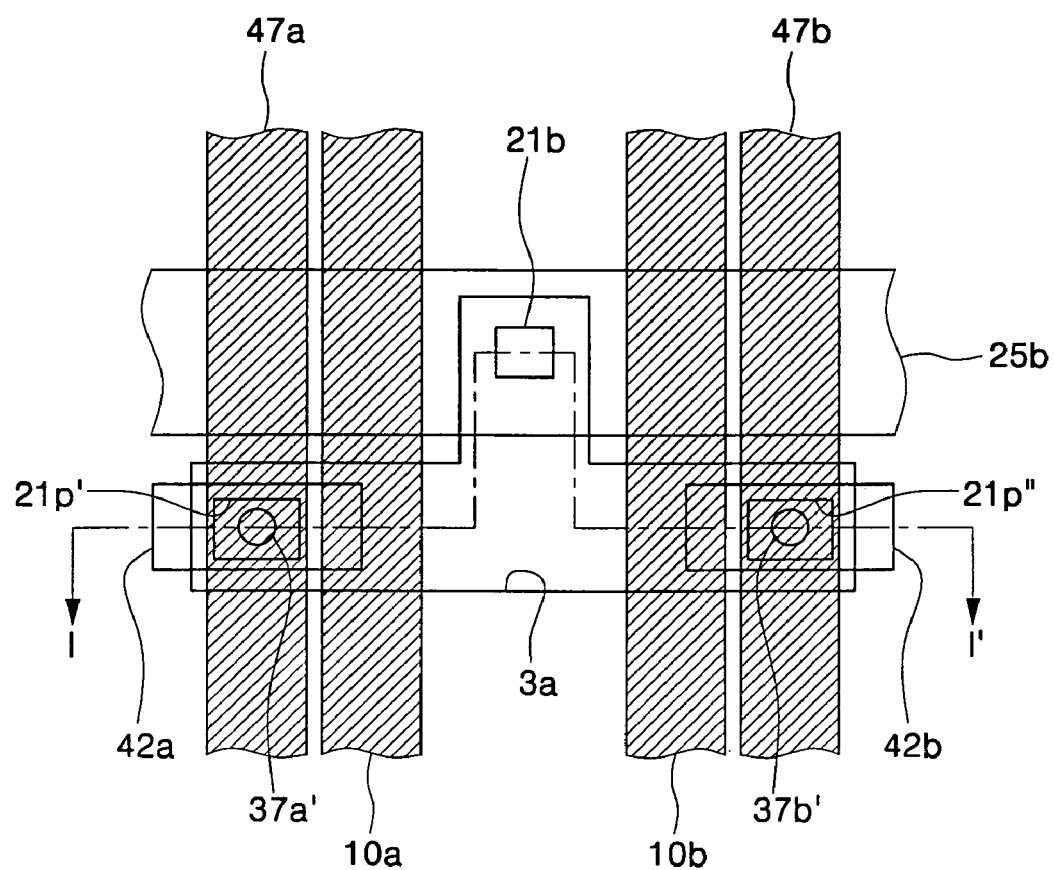
FIGS. 5 and 6 are plan and cross-sectional views, respectively, of a phase-change memory device according to some embodiments of the present invention.
Figure 6:
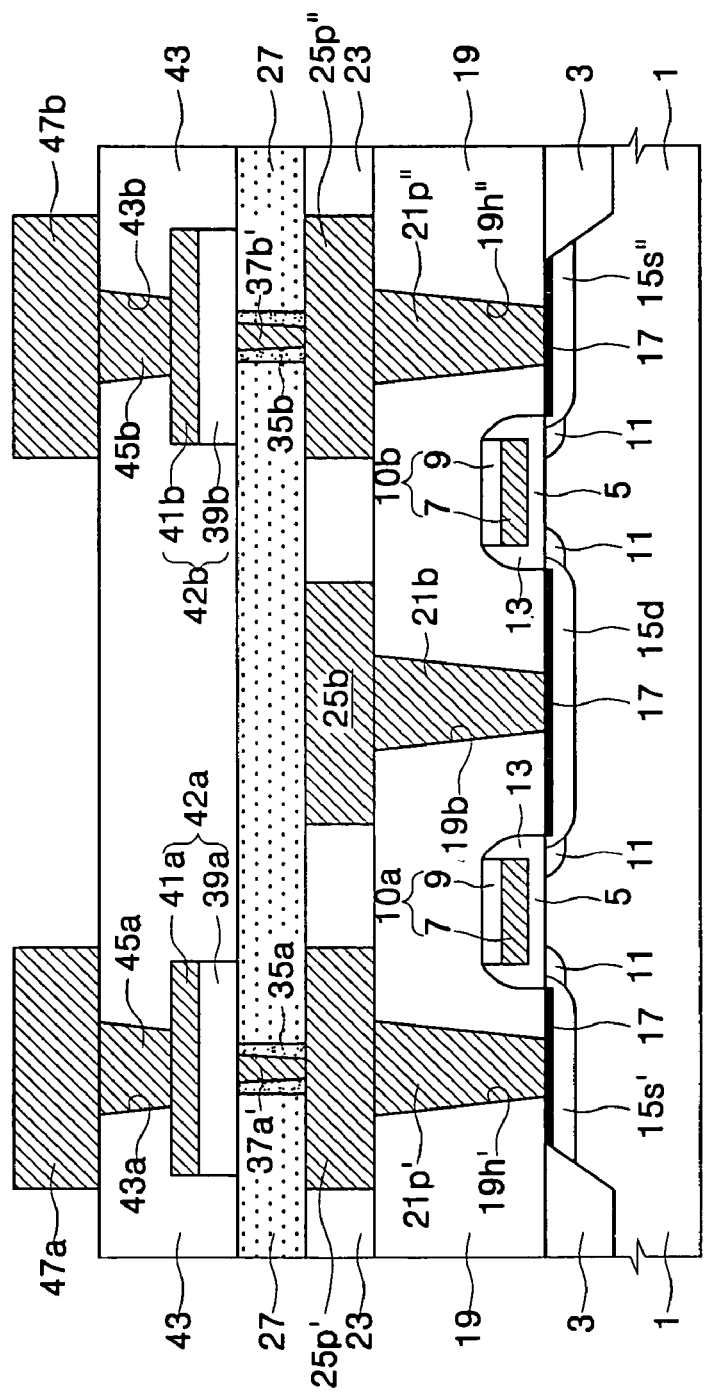

FIGS. 5 and 6 are a plan view and a cross-sectional view, respectively, of a phase-change memory device according to some embodiments of the present invention, with the cross-sectional view of FIG. 6 corresponding to a section taken along a line I–I' shown in FIG. 5. The device includes a semiconductor substrate 1 in which source/drain regions 15s', 15d, 15s'' are formed between isolation regions 3 in the substrate 1. As shown, the source/drain regions 15s', 15d, 15s'' include lightly doped regions 11 and have respective metal silicide layers 17 formed thereon. Gate structures 10a, 10b are disposed between respective pairs of the source/drain regions 15s', 15d, 15s'' and include a gate insulation layer 5, a gate electrode layer 7, a capping layer 9 and sidewall spacers 13.

A first interlayer dielectric layer 19 is disposed on the substrate 1. Conductive plugs 21p', 21b, 21p'' pass through openings 19h', 19b, 19h'' in the first interlayer dielectric 19, contacting the metal silicide layers 17 on respective ones of the source/drain regions 15s', 15d, 15s''. A second interlayer dielectric layer 23 is disposed on the first interlayer dielectric 19, and conductive pads 25p', 25p'' and a bit line 25b therein contact respective ones of the conductive plugs 21p', 21p'', 21b.

A third dielectric layer 27 is disposed on the second dielectric layer 23. Conductive small contact plugs 37a', 37b pass through the third dielectric layer 23 and contact respective ones of the conductive pads 25p', 25p'' through openings having sidewall spacers 35a, 35b therein. Phase-changeable (e.g., chalcogenide) material regions 39a, 39b are disposed on respective ones of the small contact plugs 35a, 35b, and upper electrodes 41a, 41b are disposed on respective ones of the phase-changeable material regions 39a, 39b. The phase-changeable material regions 39a, 39b and the upper electrodes 41a, 41b are surrounded by another interlayer dielectric layer 43. Conductive contact plugs 45a, 45b contact respective ones of the upper electrodes 41a, 41b through respective openings 43a, 43b in the interlayer dielectric layer 43. Respective plate lines 47a, 47b are disposed on respective ones of the contact plugs 45a, 45b. It will be appreciated that the gate structures 10a, 10b and the source/drain regions 15s', 15d, 15s'' form respective transistors that can be used to control current flow through the respective phase-changeable material regions 39a, 39b, which serve as information storage elements.

Figure 7:
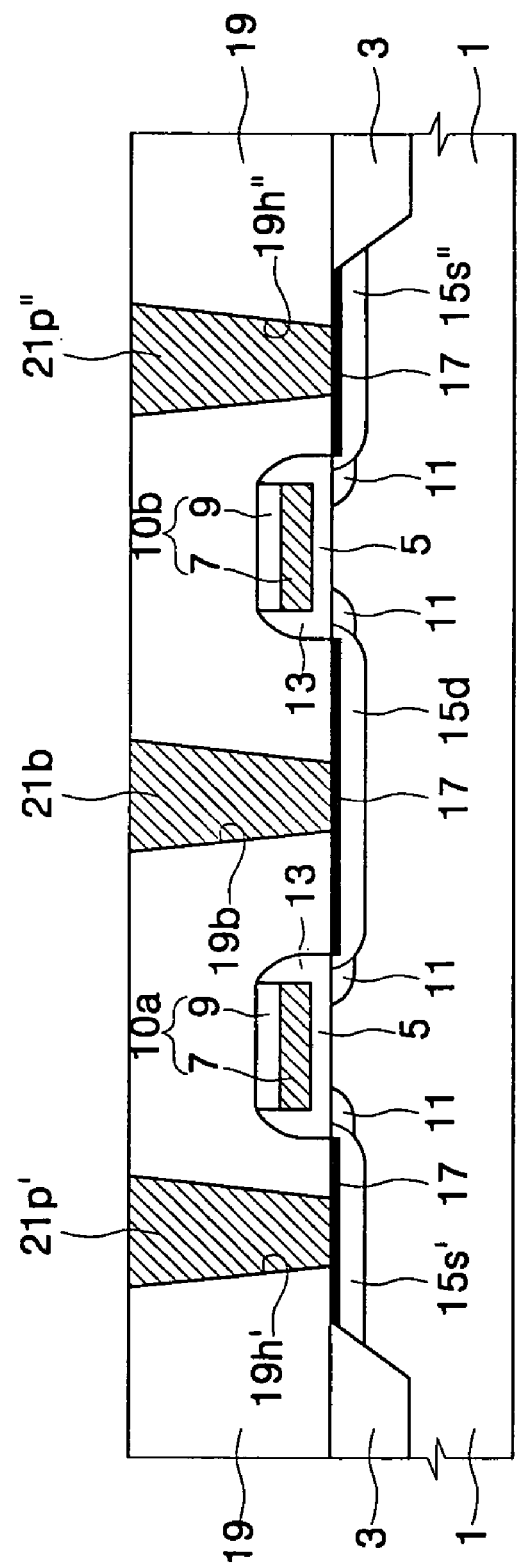
FIGS. 7–12 are cross-sectional views of intermediate fabrication products illustrating exemplary operations for forming the device of FIGS. 5 and 6 according to further embodiments of the present invention.
Figure 8:
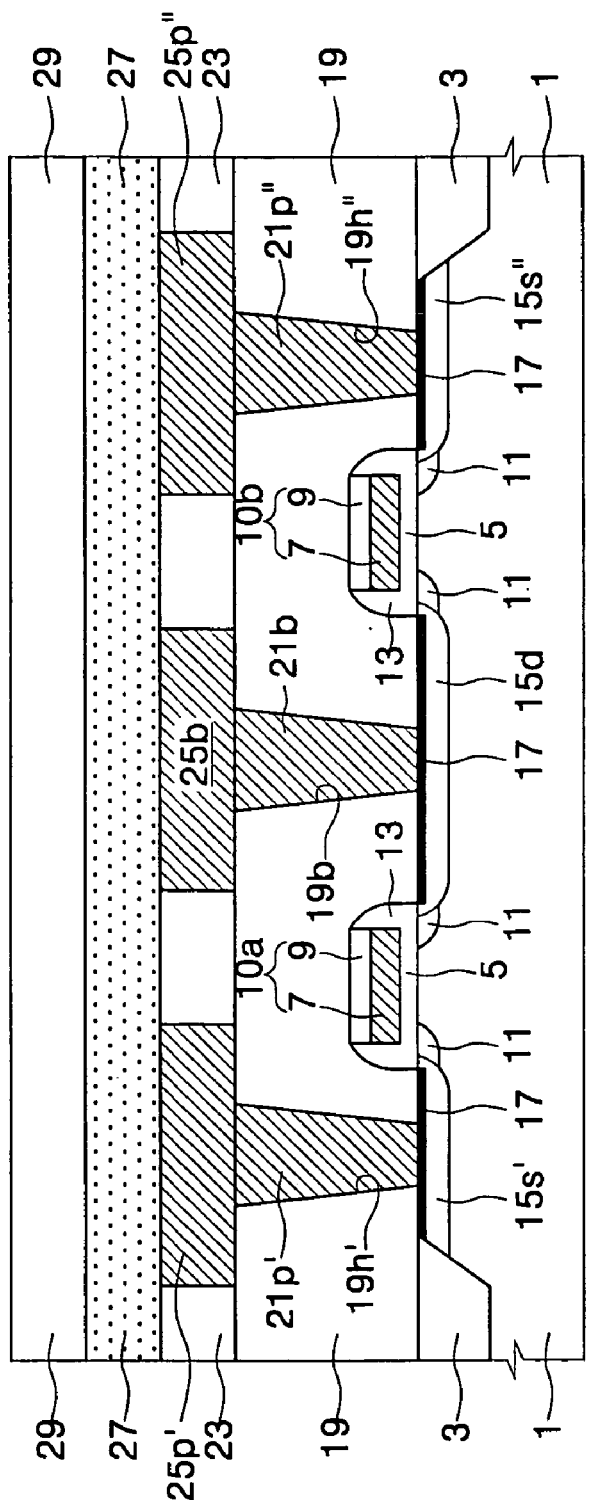

Exemplary operations for fabricating the device illustrated in FIGS. 5 and 6 will now be explained with reference to FIGS. 7–12. Referring to FIG. 7, isolation regions 3 are formed in the semiconductor substrate 1 to define an active region. Such isolation regions may be, for example, conventionally formed trench and/or field oxide regions. Spaced-apart gate structures 10a, 10b may be formed on the substrate 1 in a conventional manner, and include a gate insulation (e.g., silicon oxide) layer 5, a conductive (e.g., polysilicon and/or metal) gate electrode layer 7, an insulating (e.g., silicon oxide, silicon nitride and/or silicon oxynitride) capping layer 9 and insulating (e.g., silicon oxide, silicon nitride and/or silicon oxynitride) sidewall spacers 13. The source/drain regions 15s', 15p, 15s'' (including the lightly doped regions 11) may also be formed in a conventional fashion, e.g., by impurity ion implantations using various parts of the gate structures 10a, 10b as masks. The metal silicide layers 17, the interlayer dielectric layer 19 and the contact plugs 21p', 21b, and 21p" may also be formed conventionally. Referring to FIG. 8, the dielectric layer 23 may be formed using, for example, conventional deposition techniques, and the contact pads 25p', 25p" and bit line 25 may be formed using, for example, conventional patterning, deposition, and planarization techniques.

A dielectric layer 27 and a sacrificial layer 29 are sequentially formed on the dielectric layer 23. The dielectric layer 27 preferably is a material that is more etch-resistant than the sacrificial layer 29 in a subsequent intermediate etching process described in detail below. Also, it is preferable that the dielectric layer 27 be a material of sufficient resistance to erosion in a CMP process that is performed after the etching. For example, the dielectric layer 27 may be a silicon nitride and/or silicon oxynitride layer, and the sacrificial layer 29 may be a silicon dioxide layer. It will be appreciated, however, that other combinations of materials be used for the dielectric and sacrificial layers 27, 29.

Figure 9:
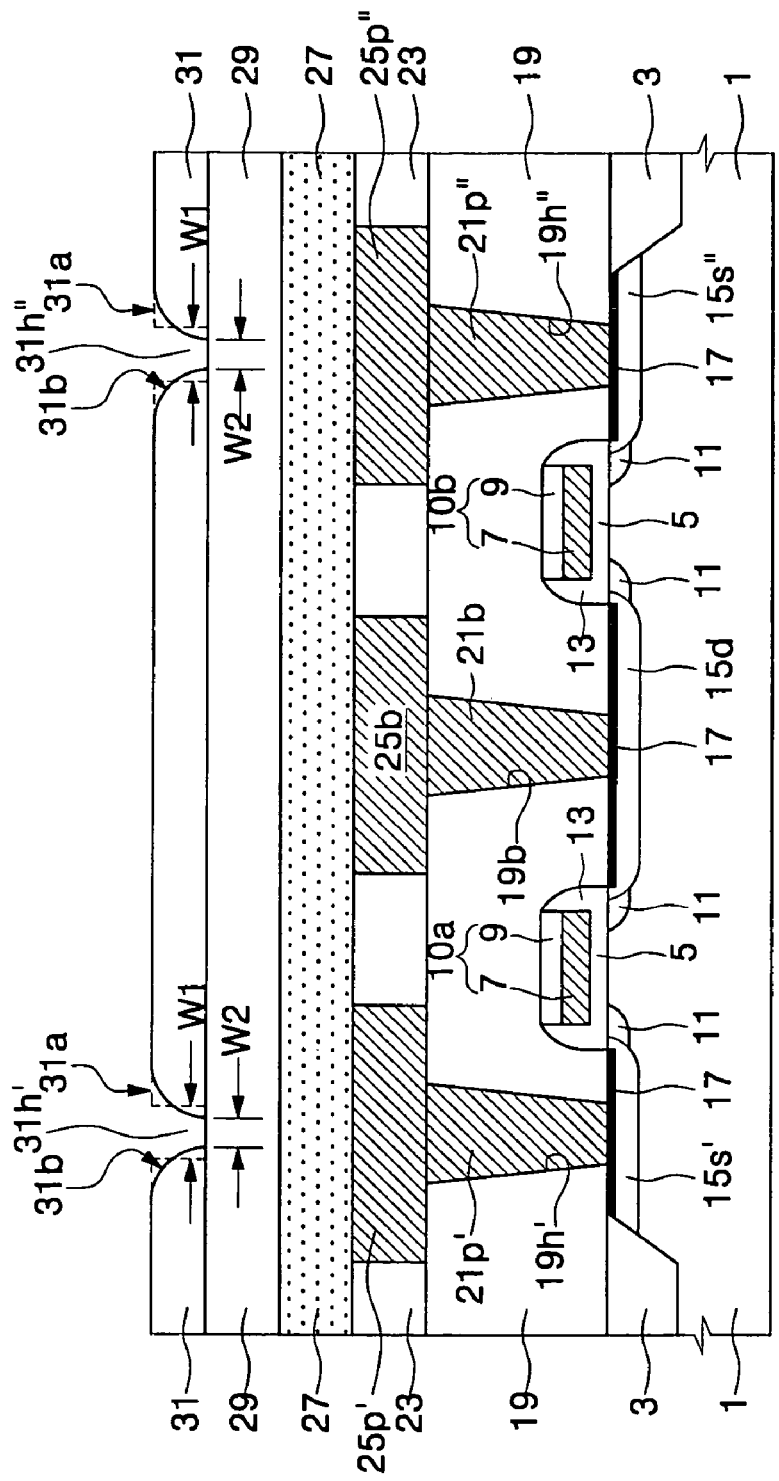

Referring to FIG. 9, a photoresist layer is formed on the sacrificial layer 29, and patterned to form a mask 31 with openings 31h', 31h" therein that expose underlying portions of the sacrificial layer 29. As shown in FIG. 9, the patterned photoresist layer 31 may be reflowed (e.g., at about 250° C. to about 350° C.) to reduce the width of the openings 31h', 31h" from a first width W1 to a second width W2 by rounding shoulder portions 31a, 31b of the pattern 31.

Figure 10:
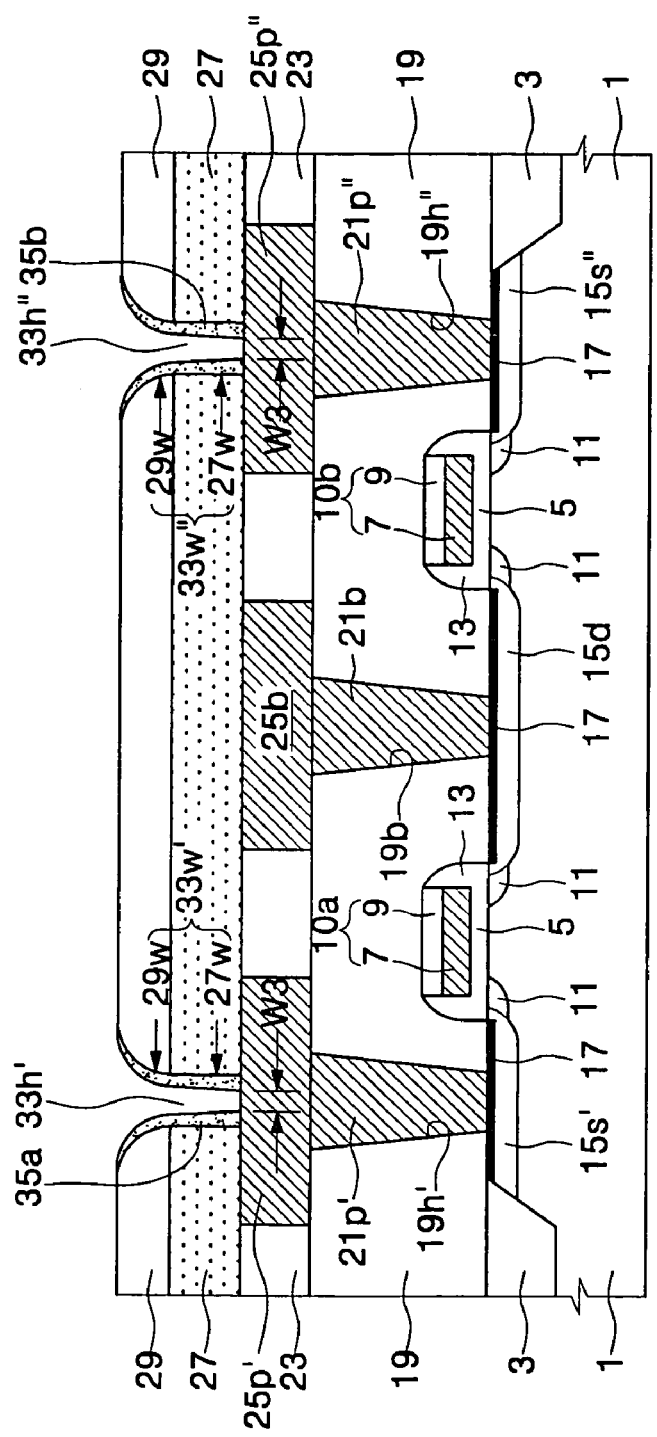

As illustrated by FIG. 10, the sacrificial layer 29 and the dielectric layer 27 are etched using the photoresist pattern 31 as a mask, exposing top portions of the pads 25p', 25p" through openings 33h', 33h". Sidewall spacers 35a, 35b may be formed on sidewalls 33w', 33w" of the openings 33h', 33h" by removing the photoresist pattern 31, depositing, for example, silicon nitride and/or silicon oxynitride on the sacrificial layer 27 and into the openings 33h', 33h", and etching to remove portions of the deposited material from the surface of the sacrificial layer 29 and the bottom of the openings 33h', 33h". As the spacers 35a, 35b serve to further narrow the openings 33h', 33h", the previously described reflowing of the photoresist pattern 31 may be omitted if the spacers 35a, 35 produce sufficiently narrow openings. Similarly, formation of the spacers 35a, 35b may be omitted if the reflow of the photoresist provides sufficient narrowing. In some embodiments, both operations may be performed.

As also shown in FIG. 10, the use of two layers 27, 29 results in the sidewalls 33w', 33w" of the holes 33h', 33h" including sidewalls 27w, 29w of the dielectric layer 27 and the sacrificial layer 29, respectively. The openings 33h', 33h" are generally flared, with a greater amount of flaring being present near the tops of the openings 33h', 33h" in the sidewalls 29w of the sacrificial layer 29. The maximum width W3 of the openings 33h', 33h" at the sidewalls 27w of the dielectric layer 27 is generally less than the maximum width at the sidewalls 29w of the sacrificial layer 29.

Figure 11:
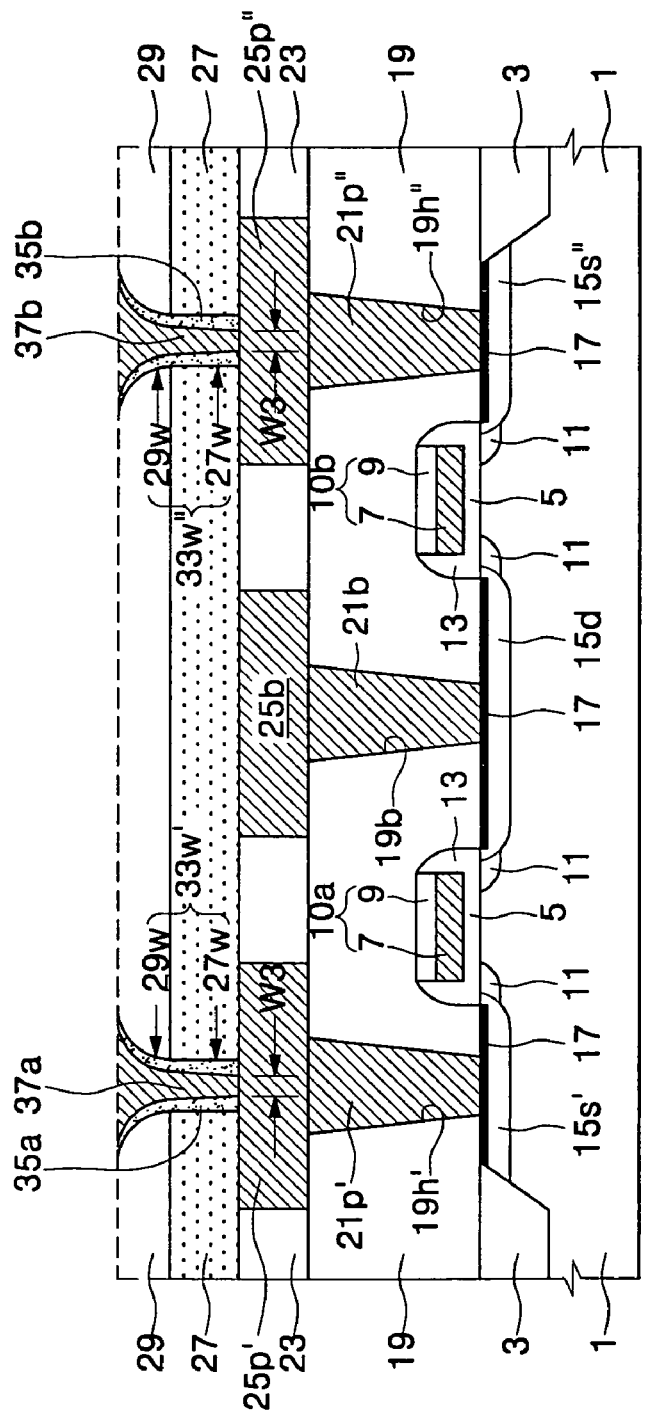

Referring to FIG. 11, a conductive material, such as titanium nitride, is deposited on the sacrificial layer and into the openings 33h', 33h", and a first CMP operation is performed to remove portions of the conductive layer and expose the sacrificial layer 29, thus forming conductive small contact plugs 37a, 37b in the openings 33h', 33h". The sacrificial layer 29 is then removed by etching (e.g., dry etching) to expose the dielectric layer 27. For the illustrated embodiments, a dry etching using an isotropic process is preferable. The etching leaves portions of the plugs 37a, 37b and the sidewall spacers 35a, 35b protruding from the dielectric layer 27. Polymer residue present on the surface of the dielectric layer 27 may be removed by ashing with an oxygen plasma, and cleaning with an HF solution.

Figure 12:
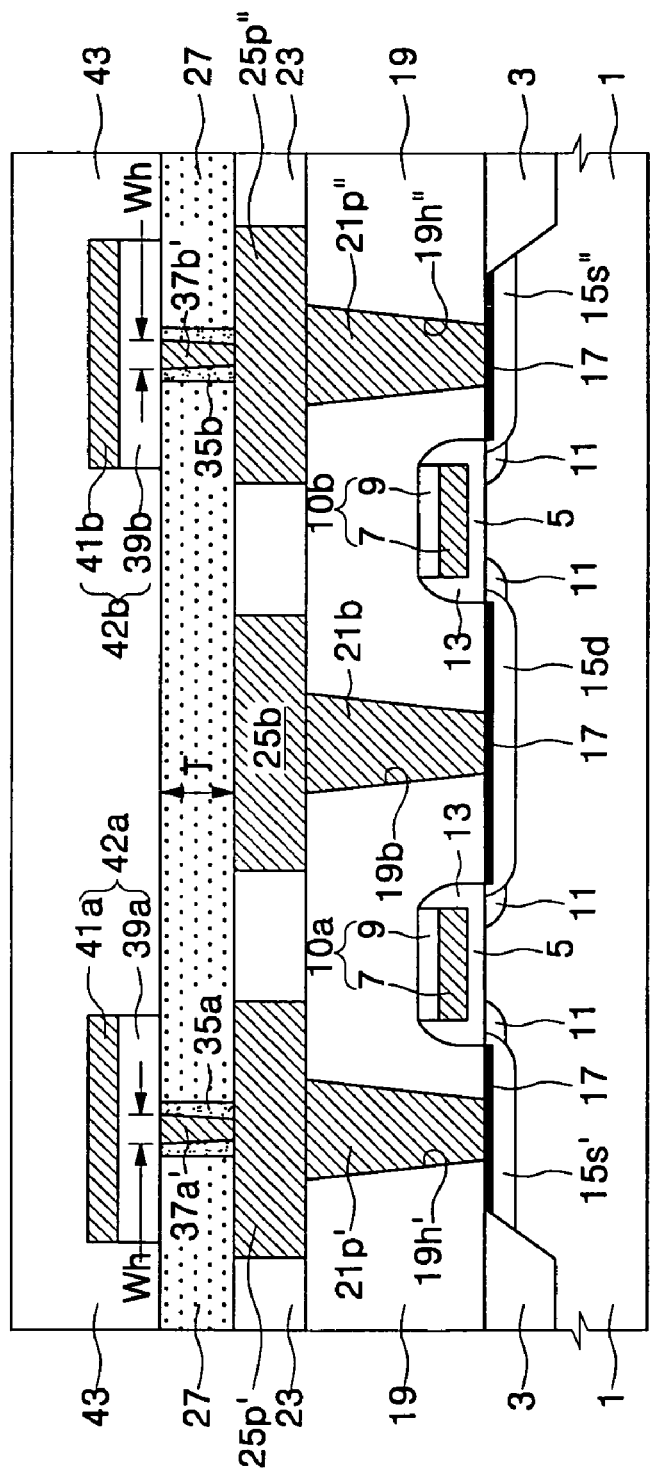

Referring to FIG. 12, the protruding portions of the plugs 37a, 37b and the sidewall spacers 35a, 35b may then be removed with a second CMP operation to produce reduced-size small contact plugs 37a', 37b'. Through the use of the sacrificial layer 29 to reduce the flaring of the contact hole and a contact formation process that involves two CMP steps with an intermediate etching, the plugs 37a', 37b' may have a desirable and more uniform narrowness Wh. Phase-changeable material regions 39a, 39b, upper electrodes 41a, 41b and interlayer dielectric layer 43 may be formed on the plugs 37a', 37b' using conventional processes.

The present invention may provide many advantages. In the illustrated phase-change memory fabrication described above, small contact plugs may be more precisely and uniformly fabricated. In addition, the use of a two-CMP process with intermediate etching can improve planarity by reducing effects such as edge over-erosion. Thus, for example, even though an addition CMP process is performed, reduction in edge over-erosion can allow subsequent planarization steps to be avoided. In other applications, the use of sacrificial layers and/or a multi-CMP process as described above can allow other structures, such as wiring patterns, contacts or vias, to be more precisely fabricated, and can also maintain planarity for photolithographic alignment and other purposes.

Referring again to FIG. 6, a single CMP step may be used to form the upper electrode contact plugs 45a and 45b. However, when the upper electrode contact plugs 45a and 45b are formed using a single CMP step, non-uniform polishing characteristics may be exhibited due to a pattern density difference between cell array region and peripheral circuit regions. In particular, because stress may occur at an edge of the cell array region during the CMP, the upper electrode contact plugs 45a and 45b may have non-uniform heights.

A conductive layer from which the upper electrodes 41a and 41b are formed may be deposited using a low power physical vapor deposition technique in order to minimize the damage applied to the phase-change material patterns 39a and 39b. Because the upper electrodes 41a and 41b may have a soft film quality, it may be difficult to over-etch the upper interlayer insulating layer 43 during formation of the plate line contact holes 43a and 43b. Accordingly, when an alignment key trench region is simultaneously formed with the plate line contact holes 43a and 43b in a portion of the upper interlayer insulating layer in order to form an alignment key for use in a subsequent photolithography process, it may be difficult to increase the depth of the alignment key trench region. To increase the depth of the alignment key trench region, the thickness of the upper interlayer insulating layer 43 could be increased. However, if the thickness of the upper interlayer insulating layer 43 is increased, it may be difficult to form upper electrode contact plugs having a uniform height in the cell array region because of non-uniform polishing characteristics of the CMP step, as previously described.

Figure 13:
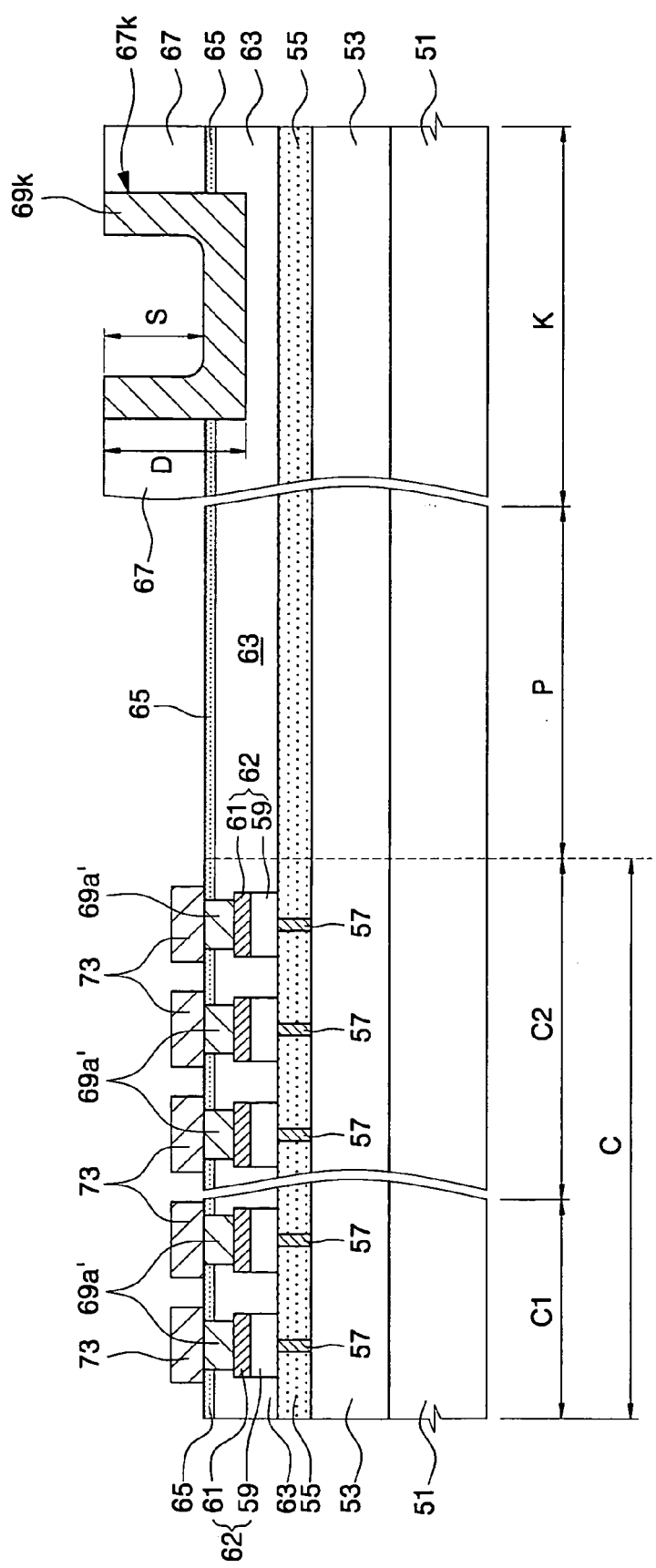
FIG. 13 is a cross-sectional view of a phase-change memory device according to additional embodiments of the present invention.

FIG. 13 illustrates phase-change memory device according to further embodiments of the present invention. An interlayer insulating layer 53 is disposed on a semiconductor substrate 51. The semiconductor substrate 51 includes a cell array region C, a peripheral circuit region P surrounding the cell array region C and an alignment key region K adjacent to the peripheral circuit region P. The cell array region C has a central region C1 and an edge region C2, and the alignment key region K may correspond to a scribe lane between main chips. Cell transistors (not shown) and peripheral circuit transistors (not shown) may be disposed on and/or in the semiconductor substrate 51, and the interlayer insulating layer 53 may cover the transistors. A protection layer 55 is disposed on the interlayer insulating layer 53. The protection layer 55 may be, for example, a silicon nitride layer and/or a silicon oxynitride layer. A plurality of lower electrodes 57 pass through the protection layer 55 in the cell array region C. The lower electrodes 57 may comprise, for example, titanium nitride. A plurality of data storage elements 62 are disposed on the lower electrodes 57. Each of the data storage elements 62 includes a data storage material pattern 59 and an upper electrode 61. The data storage material pattern 59 may be, for example, a phase-change material pattern, such as a chalcogenide layer. An inter-metal insulating layer 63 is provided around the data storage elements 62. It is preferable that the inter-metal insulating layer 63 is a planarized insulating layer having a substantially flat top surface.

A barrier layer 65 is disposed on the inter-metal insulating layer 63. The barrier layer 65 may act as at least one of an etch-stop layer, a CMP stop layer, an impurity blocking layer and/or a stress buffer layer, as described in greater detail below. The upper electrodes 61 are electrically connected to upper electrode contact plugs 69a' that pass through the barrier layer 65 and the inter-metal insulating layer 63 and have a substantially uniform height. The upper electrode contact plugs 69a' may have a width greater than the lower electrodes 57. The upper electrode contact plugs 69a' may comprise a metal, such as tungsten, titanium nitride, titanium aluminum nitride (TiAlN), tantalum nitride and/or a titanium tungsten (TiW).

A sacrificial layer 67 may be disposed on the barrier layer 65 in the alignment key region K. An alignment key trench region 67k passes through at least the sacrificial layer 67 and the barrier layer 65 and extends into the inter-metal insulating layer 63. The alignment key trench 67k thus may have a depth greater than a total thickness of the sacrificial layer 67 and the barrier layer 65. An inner wall of the alignment key trench 67k is covered with an alignment key 69k having a surface step difference S. The surface step difference S of the alignment key 69k may depend on a depth D of the alignment key trench region 67k, i.e., the step difference S may depend on the thickness of the sacrificial layer 67. Accordingly, if the thickness of the sacrificial layer 67 is increased, the alignment key 69k may have a sufficient surface step difference to prevent misalignment from occurring during a subsequent photolithography process. The alignment key 69k may be the same material layer as the upper electrode contact plugs 69a'. Plate lines 73 contact the upper electrode contact plugs 69a' in the cell array region C.

Figure 14:
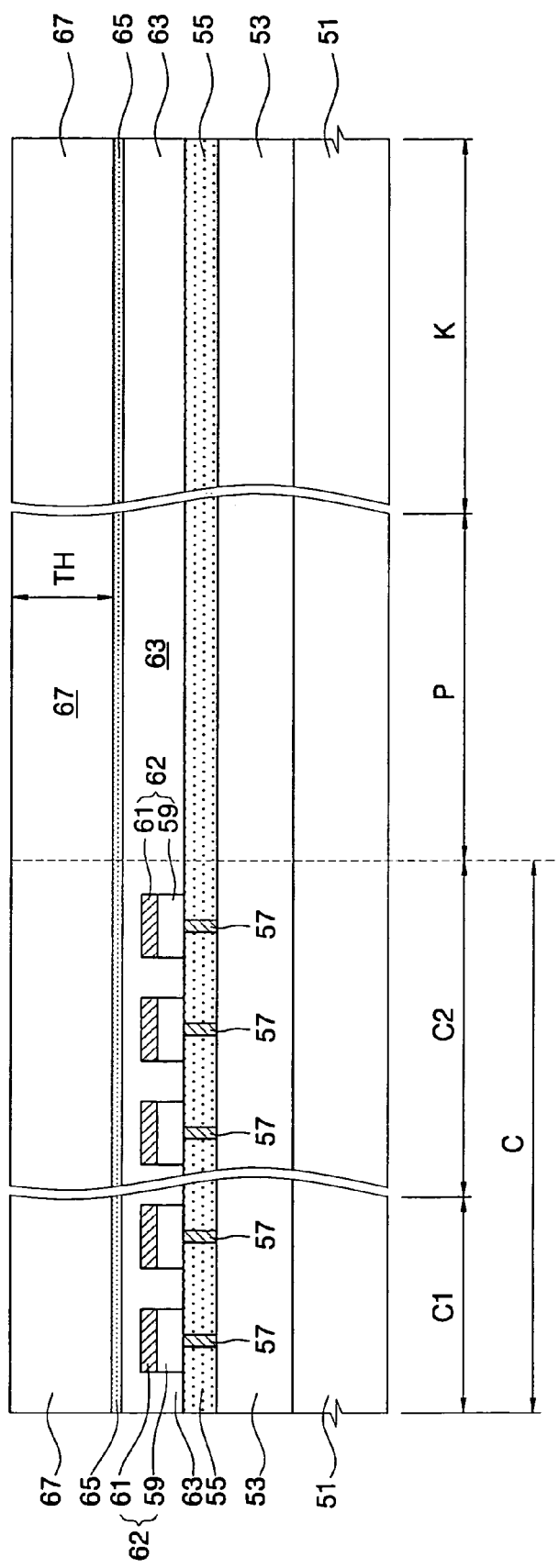
FIGS. 14–17 are cross-sectional views of intermediate fabrication products illustrating exemplary operations for forming the phase-changeable memory device of FIG. 13.

FIGS. 14 through 17 are cross-sectional views illustrating exemplary operations for fabricating the memory device of FIG. 13 according to further embodiments of the present invention. Referring to FIG. 14, an interlayer insulating layer 53 is formed on a semiconductor substrate 51. The semiconductor substrate 51 includes a cell array region C, a peripheral circuit region P surrounding the cell array region C and an alignment key region K adjacent to the peripheral circuit region P. The cell array region C has a central region C1 and an edge region C2, and the alignment key region K may be located in a scribe lane between main chips. Cell transistors (not shown) and peripheral circuit transistors (not shown) may be formed in and/or on the semiconductor substrate 51 using conventional techniques prior to formation of the interlayer insulating layer 53.

A protection layer 55 is formed on the interlayer insulating layer 53, and a plurality of lower electrodes 57 pass through the protection layer 55 in the cell array region C. The protection layer 55 and the lower electrodes 57 may be formed, for example, using techniques along the lines described above with reference to FIGS. 1-12. A plurality of data storage elements 62 is formed on the protection layer 55 in the cell array region C. The data storage elements 62 may be also formed using techniques along the lines described above. As shown, each of the data storage elements 62 includes a data storage material pattern 59 and an upper electrode 61 thereon. The respective data storage material patterns 59 cover the respective lower electrodes 57.

An inter-metal insulating layer 63 is formed on the substrate, around and on the data storage elements 62. The inter-metal insulating layer 63 may comprise, for example, a silicon oxide layer, such as an undoped silicate glass (USG) layer. Preferably, the inter-metal insulating layer 63 is planarized to provide a substantially flat top surface. A barrier layer 65 and a sacrificial layer 67 are sequentially formed on the inter-metal insulating layer 63. It is preferable that the sacrificial layer 67 is formed of a material layer having an etch selectivity with respect to the barrier layer 65. The barrier layer 65 may be formed of a material layer suitable for use as an etch-stop layer, a chemical mechanical polishing (CMP) stop layer, an impurity blocking layer and/or a stress buffer layer. For example, if the barrier layer 65 is used as an etch-stop layer and/or a CMP stop layer, the barrier layer 65 may comprise a silicon nitride layer and/or a silicon oxynitride layer and the sacrificial layer 67 may comprise a silicon oxide layer. If the barrier layer 65 is to serve as an impurity blocking layer that prevents (or reduces) impurities, such as external hydrogen atoms or oxygen atoms, from penetrating into the data storage elements 62, the barrier layer 65 may comprise a silicon nitride layer, an aluminum oxide layer and/or a titanium oxide layer, and the sacrificial layer 67 may comprise a silicon oxide layer. If it is desired for the barrier layer 65 to serve as a stress buffer layer for relieving physical stresses of the inter-metal insulating layer 63 and the sacrificial layer 67, the barrier layer 65 may comprise a material layer having a stress opposite that of the inter-metal insulating layer 63 and the sacrificial layer 67. For example, if the inter-metal insulating layer 63 and the sacrificial layer 67 comprise an undoped silicate glass (USG) layer providing tensile stress, the barrier layer 65 may comprise a silicon nitride layer providing compressive stress. The sacrificial layer 67 may be formed to a thickness TH of several thousand Å to a few μm.

Figure 15:
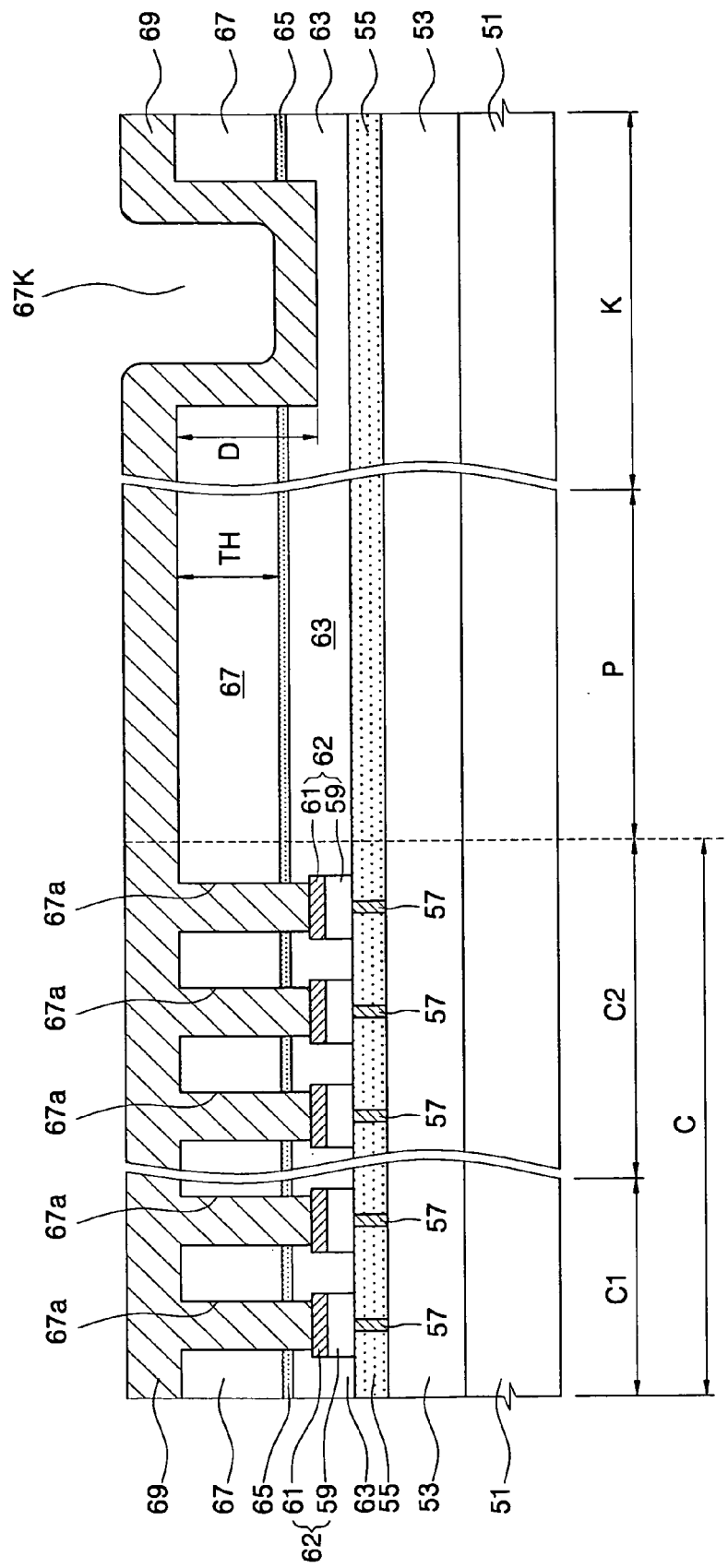

Referring to FIG. 15, the sacrificial layer 67, the barrier layer 65 and the inter-metal insulating layer 63 are patterned to form a plurality of plate line contact holes 67a that expose the upper electrodes 61. The plate line contact holes 67a may be have a greater width than the lower electrodes 57. An alignment key trench 67k may be formed in the alignment key region K during formation of the plate line contact holes 67a. The depth D of the alignment key trench region 67k may be greater than the thickness TH of the sacrificial layer 67. The depth D of the alignment key trench 67k may depend on the thickness TH of the sacrificial layer 67.

A conductive plug layer 69 is formed, filling the plate line contact holes 67a and conforming to inner surfaces of the alignment key trench 67k. The conductive plug layer 69 may comprise a metal layer, such as a tungsten layer, a titanium nitride layer, a titanium aluminum nitride (TiAlN) layer, a tantalum nitride layer and/or a titanium tungsten (TiW) layer.

Figure 16:
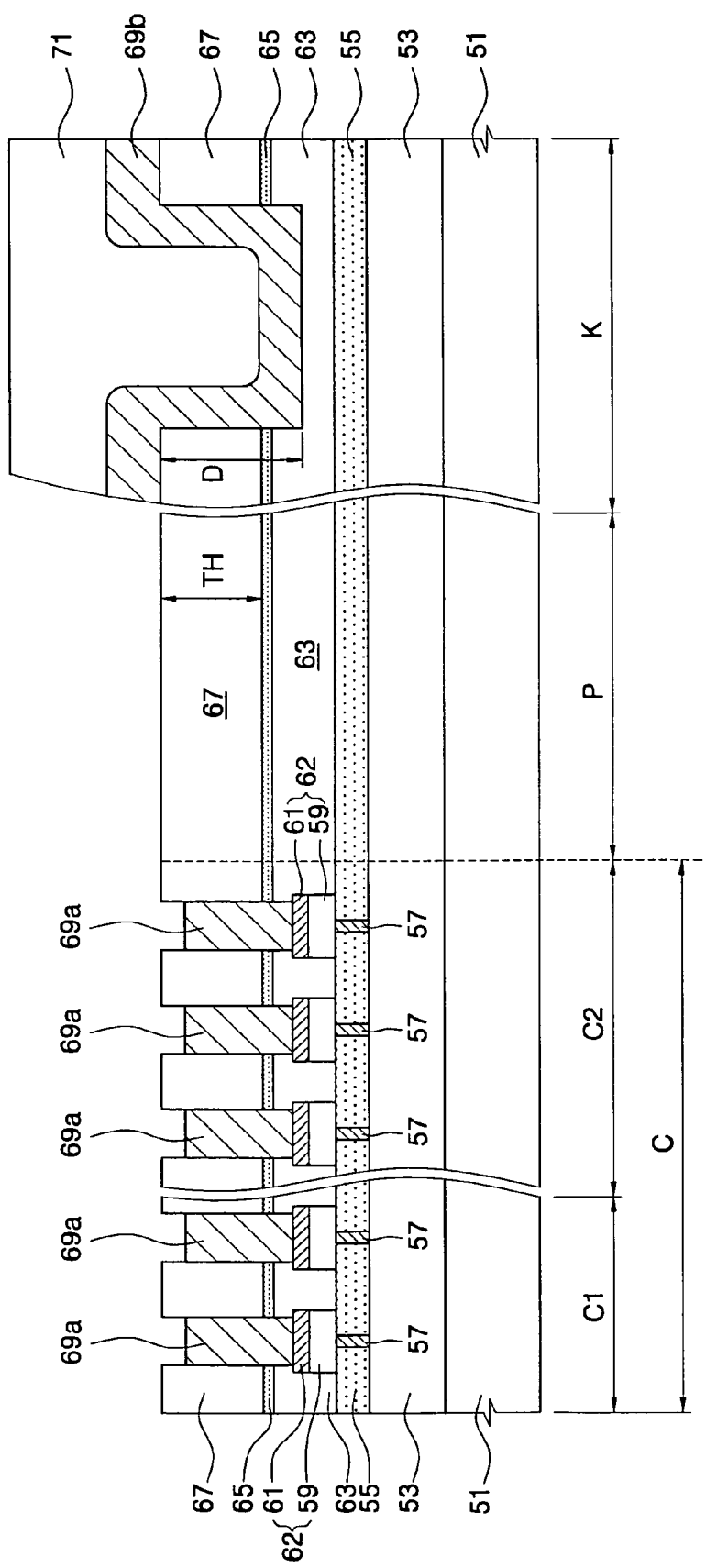

Referring to FIG. 16, a photoresist pattern 71 is formed over the conductive plug layer 69 in the alignment key region K. The conductive plug layer 69 is etched back using the photoresist pattern 71 as an etch mask to expose the sacrificial layer 67 in the cell array region C and the peripheral circuit region P. As a result, recessed contact plugs 69a are formed in the plate line contact holes 67a, and a conductive plug layer pattern 69b is formed in the alignment key region K. The conductive plug layer 69 may be etched back using a dry etching process and/or a wet etching process. If the conductive plug layer 69 comprises a tungsten layer, a wet etching process for etching back the conductive plug layer 69 may be carried out using a mixture of ammonium hydroxide ($NH_4OH$), hydrogen peroxide ($H_2O_2$), and de-ionized water.

Figure 17:
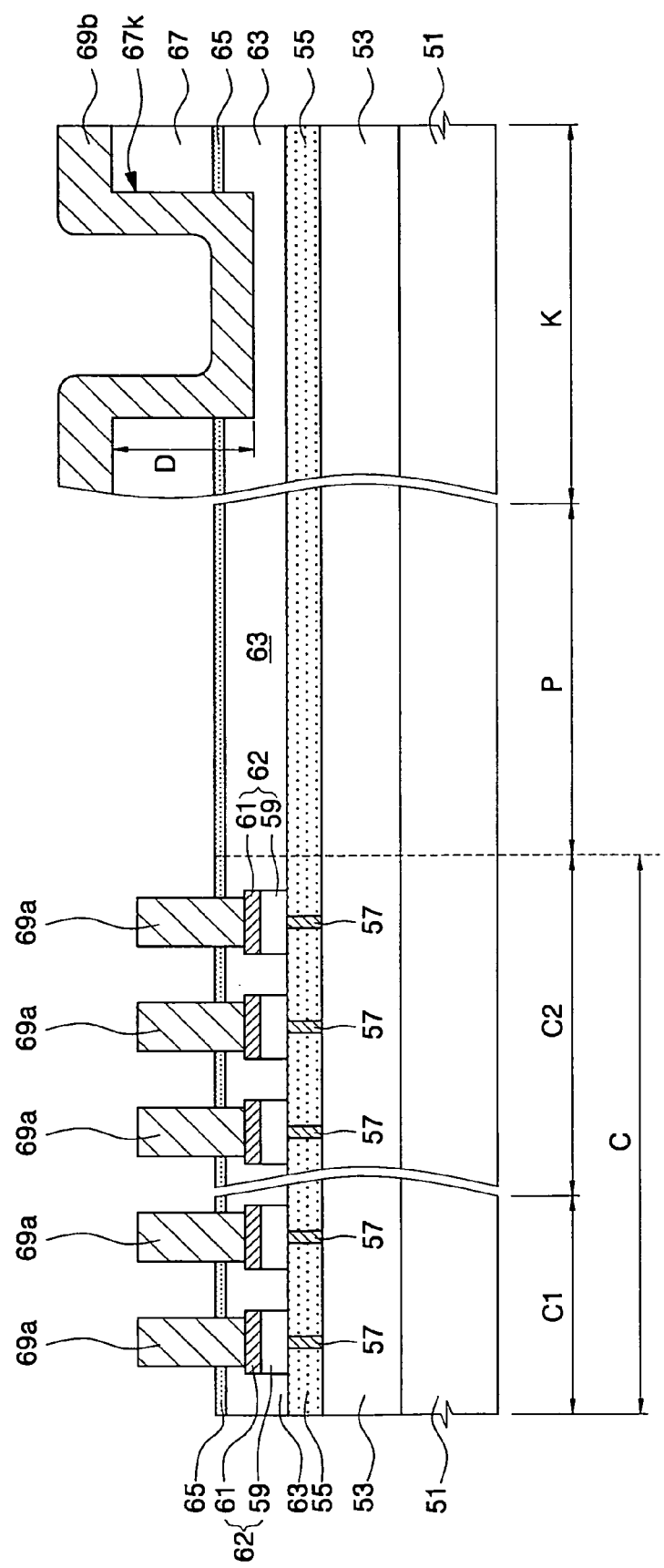

Referring to FIG. 17, the exposed sacrificial layer 67 in the cell array region C and the peripheral circuit region P may be removed using the photoresist pattern 71 as an etch mask, thus leaving the contact plugs 69a protruding above the barrier layer 65. Removal of the sacrificial layer 67 may be carried out using a dry etch-back process and/or a wet etch-back process, with the barrier layer 65 serving as an etch-stop layer. If the sacrificial layer 67 is removed using a dry etch-back process, a polymer residue may be formed on the surface of the substrate where the sacrificial layer 67 is etched back. This residue may be removed by an ashing process that uses an oxygen gas. After removal of the sacrificial layer 67, the photoresist pattern 71 may be removed.

Referring again to FIG. 13, the protruding portions of the contact plugs 69a are removed using CMP with the barrier layer 65 acting as a CMP stop layer. As a result, upper electrode contact plugs 69a' having substantially uniform height may be formed. The CMP may expose the top surface of the sacrificial layer 67 in the alignment key region K, leaving an alignment key 69k in the alignment key trench 67k. The alignment key 69k has a surface step difference S that depends on the depth D of the alignment key trench 67k. If the surface step difference S is greater than a certain value, it can prevent misalignment from occurring during a subsequent photolithography process that is performed using the alignment key 69k.

Subsequently, a conductive layer, such as a metal layer, is formed on the substrate having the upper electrode contact plugs 69a' and the alignment key 69k thereon, and the conductive layer may be patterned using a photolithography process and an etching process to form plate lines 73 that cover the upper electrode contact plugs 69a'. The photolithography process for forming the plate lines 73 may be performed using the alignment key 69k. According to the aforedescribed embodiments, it is possible to reduce misalignment when the photolithography process for formation of the plate lines 73 is performed, because the surface step difference S is sufficiently large to allow accurate registration.

In still further embodiments of the present invention, the upper electrode contact plugs 69a' may be formed using the same methods as the embodiments previously described, i.e., the upper electrode contact plugs 69a' may be formed using first and second chemical mechanical polishing processes with an intervening etch-back process. In more detail, after formation of the conductive plug layer 69 shown in FIG. 1, the conductive plug layer 69 is planarized using the first CMP process to expose the top surface of the sacrificial layer 67. As a result, the recessed contact plugs 69a may be formed in the cell array region C, as shown in FIG. 16. In this case, a preliminary alignment key 69k having the substantially the same surface step difference S as shown in FIG. 13 may be formed in the alignment key region K.

Subsequently, the exposed sacrificial layer 67 may be removed using a single etch-back step to protrude the contact plugs 69a and the alignment key 67k. The etch-back process for removing the exposed sacrificial layer 67 may be carried out using the barrier layer 65 as an etch-stop layer. The protruding portions of the contact plugs 69a and the alignment key 67k may then be removed using a second CMP process, with the barrier layer 65 acting as a polishing stop layer. As a result, upper electrode contact plugs (69a' in FIG. 14) having substantially uniform height throughout the cell array region C may be formed, and an alignment key having a desirable surface step difference. The surface step difference of the alignment key may be increased by increasing the thickness of the inter-metal insulating layer 63.

FIGS. 18–21 are cross-sectional views illustrating exemplary operations for forming phase-change memory cells according to yet other embodiments of the present invention. Because such operations include features and operations similar to those explained with reference to FIGS. 7–9, description of those operations will not be repeated.

Figure 18:
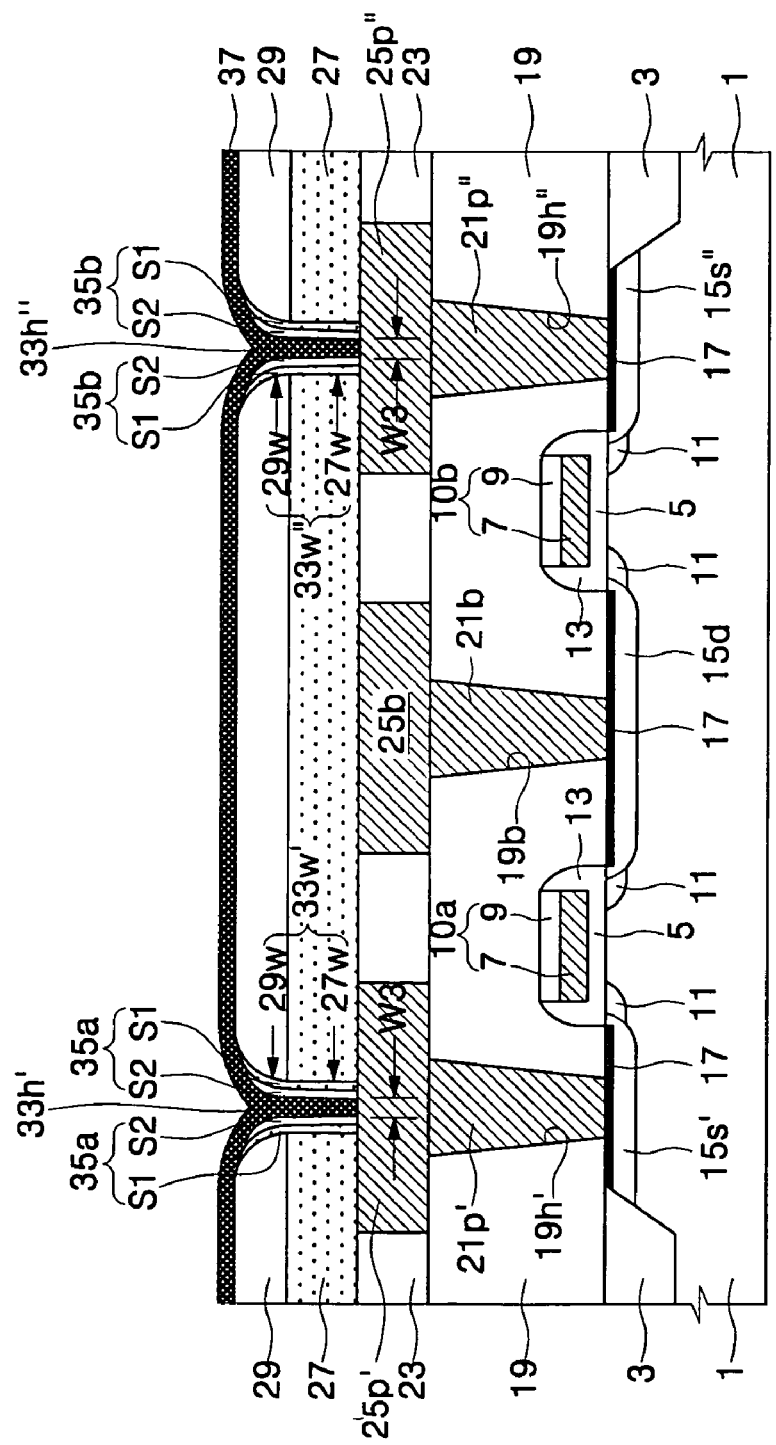
FIGS. 18–21 are cross-sectional views of intermediate fabrication products illustrating exemplary operations for forming phase-change memory cells according to further embodiments of the present invention.

Referring to FIGS. 5, 9 and 18, the sacrificial layer 29 and the protection layer 27 may be sequentially etched using the flowed photoresist pattern 31 as an etch mask, thereby forming a first node contact hole 33h' and a second node contact hole 33h" that expose the first and second source pads 25p' and 25p", respectively. As shown in FIG. 18, in the node contact holes 33h' and 33h", sloped sidewalls 33W' and 33W" may be formed that generally conform to the sloped sidewalls 31b in the openings 31h' and 31h", respectively. The node contact holes 33h' and 33h" may have a width less than or equal to the second width W2. Each of the sidewalls 33W' and 33W" includes a lower sidewall 27W and an upper sidewall 29W. The lower sidewall 27W has an almost vertical profile, while the upper sidewall 29W has a slope that is less steep than the lower sidewall 27W. The width of each of the node contact holes 33h' and 33h" is less at lower portions than upper portions of the holes 33h' and 33h".

Multiple sidewall spacers 35a and 35b may be formed on each of the first and second sidewalls 33h' and 33h". These further reduce the width of each of the node contact holes 33h' and 33h" at their lower portions to a third width W3, which is less than the second width W2. The sidewall spacers 35a and 35b may include at least one insulating layer. The insulating layer may be an insulating layer formed without using an oxidation gas, such as an oxygen gas. This can reduce or eliminate oxidation of the first and second source pads 25p' and 25p" when forming the spacers 35a and 35b. For example, the sidewall spacers 35a and 35b may comprise silicon nitride, silicon oxynitride, silicon oxide, and/or metal oxide. Also, the multiple sidewall spacers 35a and 35b may be formed by sequentially forming a silicon oxynitride layer S1 and a silicon nitride layer S2. The sidewall spacers 35a and 35b may include more than two insulating layers.

Further embodiments of the present invention may selectively employ a process of flowing a photoresist pattern, such as the flowing of the photoresist pattern 31 described with reference to FIG. 9, and/or formation of multiple sidewall spacers, such as the spacers 35a and 35b described with reference to FIG. 18. For instance, it will be understood that a process of flowing a photoresist pattern, such as the photoresist pattern 31, may be omitted in some embodiments where sidewall spacers, such as spacers 35a and 35b, are formed. Similarly, formation of sidewall spacers, such as the spacers 35a and 35b, may be omitted in some embodiments where a flowed photoresist pattern, such as photoresist pattern 31, is used.

Still referring to FIG. 18, a conductive layer 37 is formed in the node contact holes 33h' and 33h" and on the sacrificial layer 29. The conductive layer 37 may comprise, for example, a titanium aluminum nitride layer formed using an atomic layer deposition (ALD) process. In some embodiments, the conductive layer 37 may comprise a titanium nitride layer formed using an ALD process, which may have good gap-filling characteristics. Generally, it may be advantageous in terms of mass production to form the conductive layer 37 to a thickness that allows the node contact holes 33h' and 33h" to be completely filled. A titanium aluminum nitride layer generally has a resistivity higher than a titanium nitride layer.

Figure 19:
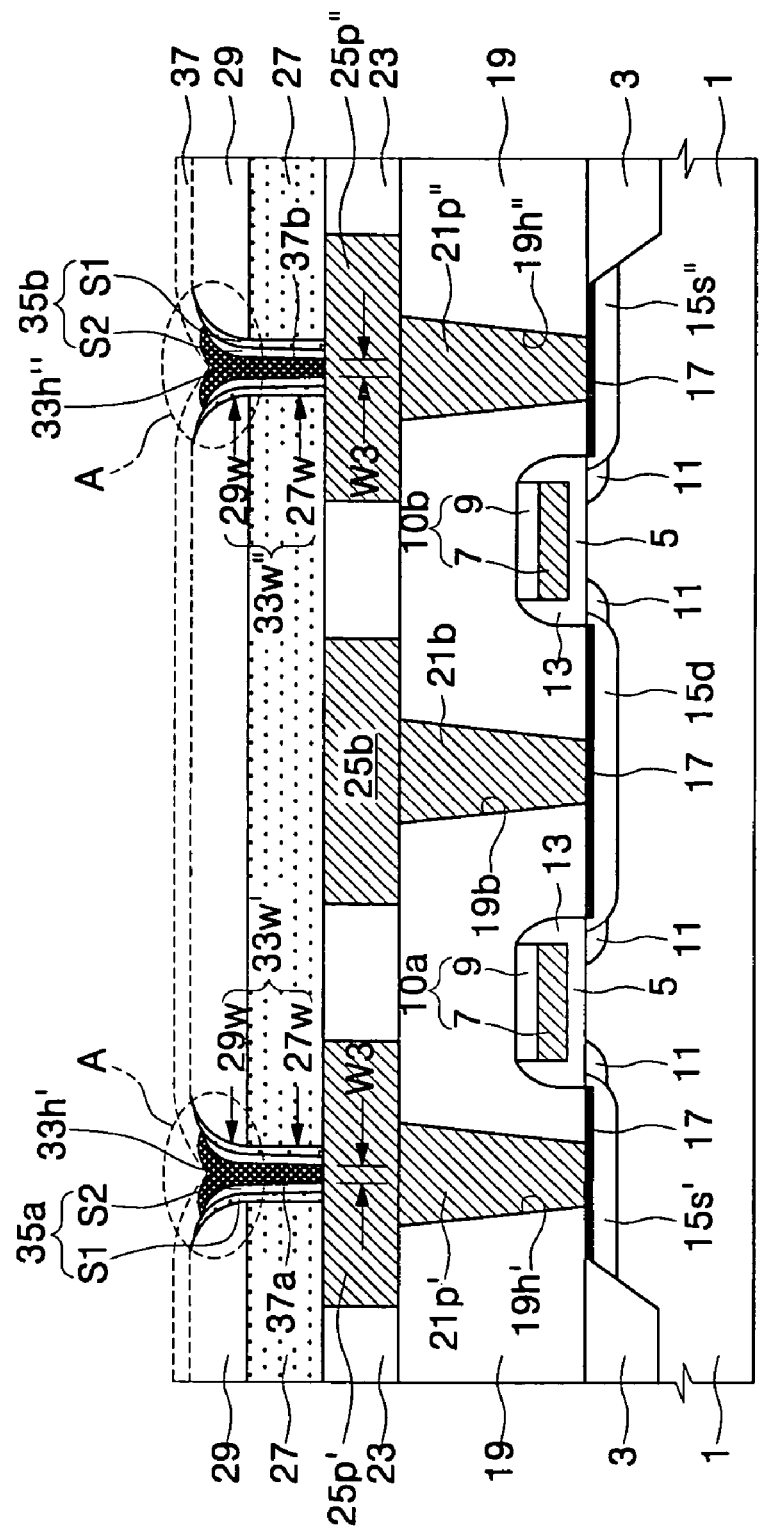

Referring to FIGS. 5 and 19, the conductive layer 37 and the sacrificial layer 29 are selectively removed to expose the protection layer 27. As a result, conductive plugs 37a and 37b are formed in the first and second node contact holes 33h' and 33h", respectively. The conductive layer 37 and the sacrificial layer 29 may be selectively removed using, for example, a dry etching process, such as an isotropic etch recipe using plasma. For example, an exemplary isotropic etch recipe may make use of CO gas, Ar gas, $O_2$ gas, $C_5F_8$ gas, and/or $CH_2F_2$ gas.

If $C_5F_8$ gas is used, a titanium aluminum nitride layer, a silicon oxynitride layer, and a silicon oxide layer may be selectively etched in the ratio of about 1:1:10. The gas may react with a nitride layer, thereby generating a polymer residue, which may slow down the etch rate, facilitating selective removal of the sacrificial layer 29 while reducing damage to the protection layer 27 during the etching process. Polymer residue formed in removing the sacrificial layer 29 may be removed using, for example, an ashing process employing an oxygen plasma. As a result of the etching process, upper portions A of the conductive plugs 37a and 37b protrude from the protection layer 27.

Figure 20:
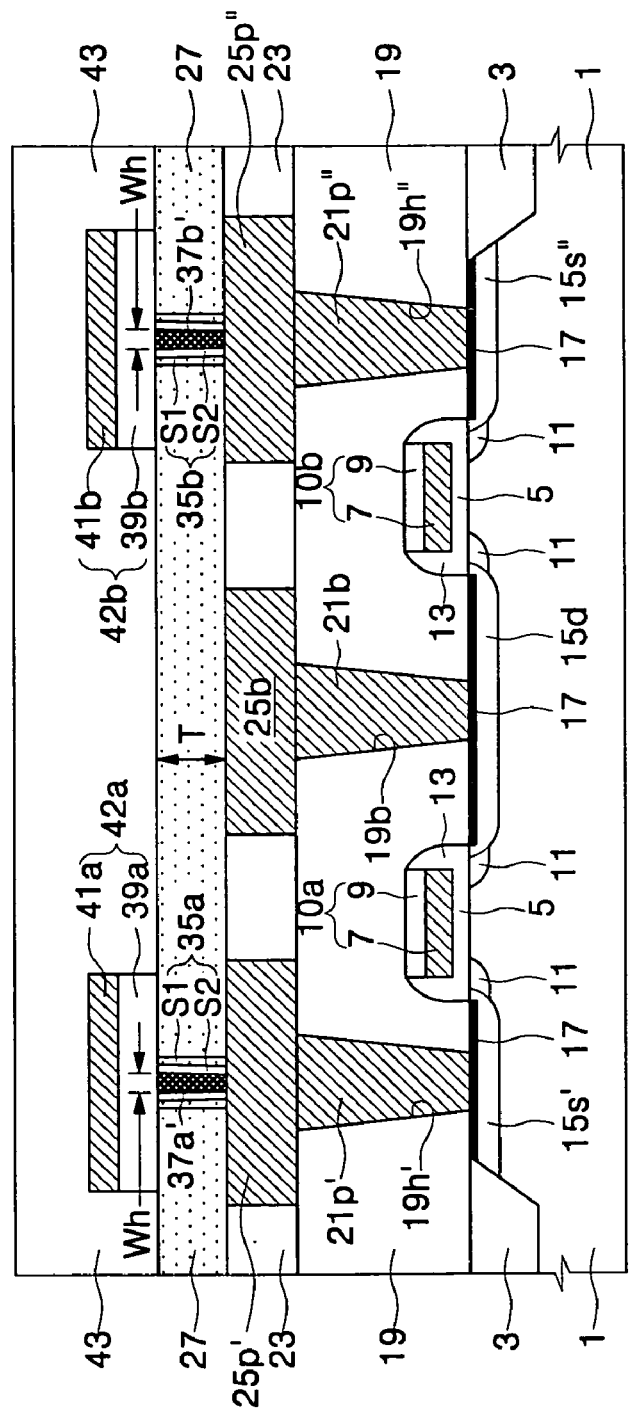

Referring to FIGS. 5 and 20, the protruding upper portions A of the conductive plugs may be removed using a planarization process, such as a chemical mechanical polishing (CMP) process or an etch-back process. During the planarization, the multiple sidewall spacers 35a and 35b may also be planarized so that they have a height substantially equal to a thickness T of the protection layer 27. As a result, a first contact plug 37a' and a second contact plug 37b' with substantially uniform height and width may be formed in the protection layer 27. The first contact plug 37a' contacts the first source pad 25p', and the second contact plug 37b' contacts the second source pad 25p". Sidewalls of the first and second contact plugs 37a' and 37b' adjoin the sidewall spacers 35a and 35b. An upper width Wh of each of the final contact plugs 37a' and 37b' is smaller than an outer diameter of the multi-layer spacers 35a and 35b. When used as heaters for phase-change memory cells, the narrowness of the contact plugs 37a' and 37b' may further improve write efficiency.

After the planarization process is performed, polymer residues and/or particles may remain on the protection layer 27 and the contact plugs 37a' and 37b'. The polymer residues and particles may lead to an increase in contact resistance variation between the contact plugs 37a' and 37b' and material layers to be formed on the final contact plugs 37a' and 37b' in the subsequent process. When the contact plugs 37a' and 37b' are non-uniform in contact resistance, phase-change memory cells subsequently formed thereon may not provide desired performance. Accordingly, it may be desirable to remove the polymer residues and/or other contaminants using a cleaning process. The cleaning process may include a dry cleaning process and a wet cleaning process. The dry cleaning process may include, for example, an ashing process using oxygen plasma, and the wet cleaning process may include, for example, cleaning with a hydrofluoric acid solution. The hydrofluoric acid solution may be, for example, a diluted hydrofluoric acid solution.

Figure 21:
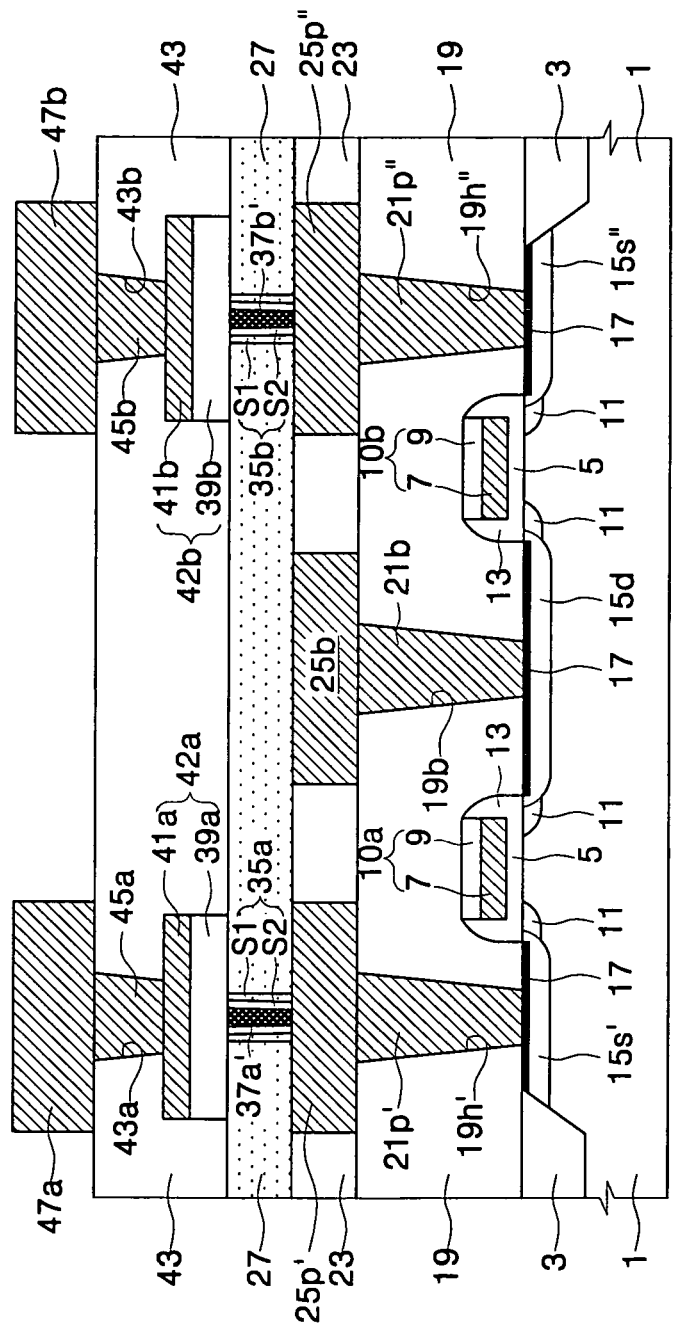

Referring to FIG. 20, a first data storage element 42a and a second data storage element 42b may be formed in a manner similar to that described above with reference to FIG. 12. An upper interlayer insulating layer 43 may be formed on the data storage elements 42a and 42b and the protection layer 27. Referring to FIGS. 5 and 21, a first upper electrode contact plug 45a and a second upper electrode contact plug 45b may be formed, and a first plate line 47a and a second plate line 47b may be formed on the first and second upper electrode contact plugs 45a and 45b, respectively.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating contacts, comprising:
sequentially forming a protection layer and a sacrificial layer on a semiconductor substrate;
forming a contact hole through the sacrificial layer and the protection layer;
forming a sidewall spacer on sidewalls of the sacrificial layer and the protection layer in the contact hole;
forming a conductive layer on the sacrificial layer and in the contact hole adjacent the sidewall spacer;
removing portions of the conductive layer and the sacrificial layer to expose the protection layer and form a conductive plug with the sidewall spacer thereon protruding from the protection layer; and
removing protruding portions of the conductive plug and the sidewall spacer to leave a contact plug in the protection layer.

2. The method according to claim 1, wherein the protection layer comprises an insulating layer having an etch selectivity with respect to the sacrificial layer.

3. The method according to claim 2, wherein the protection layer comprises one of a silicon nitride layer and/or a silicon oxynitride layer, and wherein the sacrificial layer comprises a silicon oxide layer.

4. The method according to claim 1, wherein an upper portion of the contact hole is wider than a lower portion of the contact hole.

5. A method of fabricating contacts, comprising:
sequentially forming a protection layer and a sacrificial layer on a semiconductor substrate;
forming a photoresist pattern on the sacrificial layer, the photoresist pattern having an opening that exposes a portion of the sacrificial layer;
flowing the photoresist pattern to slope sidewalls of the photoresist pattern in the opening such that an upper portion of the opening is wider than a lower portion of the opening;
etching the sacrificial layer and the protection layer using the flowed photoresist pattern as an etch mask to form a contact hole through the sacrificial layer and the protection layer, wherein an upper portion of the contact hole is wider than a lower portion of the contact hole;

removing the flowed photoresist pattern:

forming a conductive layer on the sacrificial layer and in the contact hole;

removing portions of the conductive layer and the sacrificial layer to expose the protection layer and form a conductive plug protruding from the protection layer; and removing a protruding portion of the conductive plug to leave a contact plug in the protection layer.

6. The method according to claim 5, further comprising, after removing the flowed photoresist pattern, forming multiple sidewall spacers on sidewalls of the sacrificial layer and the protection layer in the contact hole through the sacrificial layer and the protection layer.

7. The method according to claim 6, wherein the multiple sidewall spacers comprise an insulating layer formed without using an oxidation gas.

8. The method according to claim 7, wherein forming multiple sidewall spacers comprises forming the multiple sidewall spacers from a silicon nitride layer, a silicon oxynitride layer, a silicon oxide layer, and/or a metal oxide layer.

9. The method according to claim 7, wherein forming multiple sidewall spacers comprises sequentially forming a silicon oxynitride layer and a silicon nitride layer on the sidewalls of the sacrificial layer and the protection layer.

10. The method according to claim 4: wherein forming a contact hole comprises:

forming a photoresist pattern on the sacrificial layer, the photoresist pattern having an opening therein that exposes a portion of the sacrificial layer; and etching the sacrificial layer and the protection layer using the photoresist pattern as an etch mask to form a hole through the sacrificial layer and the protection layer; and wherein forming a sidewall spacer on sidewalls of the sacrificial layer and the protection layer in the contact hole comprises forming multiple sidewall spacers on sidewalls of the sacrificial layer and the protection layer in the hole through the sacrificial layer and the protection layer.

11. The method according to claim 10, wherein the multiple sidewall spacers comprise an insulating layer formed without using an oxidation gas.

12. The method according to claim 11, wherein forming multiple sidewall spacers comprises forming the multiple sidewall spacers from a silicon nitride layer, a silicon oxynitride layer, a silicon oxide layer, and/or a metal oxide layer.

13. The method according to claim 11, wherein forming multiple sidewall spacers comprises sequentially forming a silicon oxynitride layer and a silicon nitride layer on the sidewalls of the sacrificial layer and the protection layer.

14. The method according to claim 1, wherein forming a conductive layer on the sacrificial layer and in the contact hole comprises forming a titanium aluminum nitride layer and/or a titanium nitride layer.

15. The method according to claim 1, wherein removing portions of the conductive layer and the sacrificial layer to expose the protection layer and form a conductive plug with the sidewall spacer thereon protruding from the protection layer comprises dry etching the conductive layer and the sacrificial layer.

16. The method according to claim 15, wherein dry etching the conductive layer and the sacrificial layer comprises isotropic etching using a plasma.

17. The method according to claim 16, further comprising ashing a polymer residue on the protection layer.

18. The method according to claim 1, wherein removing protruding portions of the conductive plug and the sidewall spacer to leave a contact plug in the protection layer comprises chemical mechanical polishing (CMP) and/or an etch-back process.

19. A method of fabricating a phase-change memory device, comprising:

sequentially forming a protection layer and a sacrificial layer on a semiconductor substrate, the sacrificial layer having an etch selectivity with respect to the protection layer;

forming a contact hole through the sacrificial layer and the protection layer;

forming a sidewall spacer on sidewalls of the sacrificial layer and the protection layer in the contact hole;

forming a conductive layer on the sacrificial layer and in the contact hole adjacent the sidewall spacer;

removing portions of the conductive layer and the sacrificial layer to expose the protection layer and form a conductive plug with the sidewall spacer thereon that protrudes from the protection layer;

removing protruding portions of the conductive plug and the sidewall spacer to leave a contact plug in the protection layer; and forming a phase-change data storage element on the contact plug.

20. The method according to claim 19, further comprising, before forming the protection layer:

forming a MOS access transistor in the semiconductor substrate, the MOS access transistor including spaced apart source and drain regions, a channel region disposed between the source and drain regions, and a gate electrode on the channel region; and forming a lower interlayer insulating layer on the MOS access transistor; and forming contact pads electrically connected to the source region in the lower interlayer insulating layer, wherein the protection layer is formed on the contact pads and the lower interlayer insulating layer, and wherein the contact hole exposes one of the contact pads.

21. The method according to claim 19, wherein the protection layer comprises a silicon nitride layer and/or a silicon oxynitride layer, and wherein the sacrificial layer comprises a silicon oxide layer.

22. A method of fabricating a phase-change memory device, comprising:

sequentially forming a protection layer and a sacrificial layer on a semiconductor substrate, the sacrificial layer having an etch selectivity with respect to the protection layer;

forming a photoresist pattern on the sacrificial layer, the photoresist pattern having an opening therein that exposes a portion of the sacrificial layer;

flowing the photoresist pattern to slope a sidewall of the photoresist pattern in the opening such that a lower portion of the opening is narrower than an upper portion of the opening;

etching the sacrificial layer and the protection layer using the flowed photoresist pattern as an etch mask to form a contact hole through the sacrificial layer and the protection layer;

removing the flowed photoresist pattern;

forming a conductive layer on the sacrificial layer and in the contact hole;

removing portions of the conductive layer and the sacrificial layer to expose the protection layer and form a conductive plug that protrudes from the protection layer;

removing a protruding portion of the conductive plug to leave a contact plug in the protection layer; and forming a phase-change data storage element on the contact plug.

23. The method according to claim 22 further comprising, after removing the flowed photoresist pattern, forming multiple sidewall spacers on sidewalls of the sacrificial layer and the protection layer in the contact hole through the sacrificial layer and the protection layer.

24. The method according to claim 23, wherein the multiple sidewall spacers comprise an insulating layer formed without using an oxidation gas.

25. The method according to claim 24, wherein the multiple sidewall spacers comprise a silicon nitride layer, a silicon oxynitride layer, a silicon oxide layer, and/or a metal oxide layer.

26. The method according to claim 24, wherein the multiple sidewall spacers are formed by sequentially forming a silicon oxynitride layer and a silicon nitride layer on the sidewalls of the sacrificial layer and the protection layer.

27. The method according to claim 19: wherein forming a contact hole comprises:

forming a photoresist pattern on the sacrificial layer, the photoresist pattern having an opening therein that exposes a portion of the sacrificial layer; and etching the sacrificial layer and the protection layer using the photoresist pattern as an etch mask to form a hole through the sacrificial layer and the protection layer; and wherein forming a sidewall spacer on sidewalls of the sacrificial layer and the protection layer in the contact hole comprises forming multiple sidewall spacers on sidewalls of the sacrificial layer and the protection layer in the hole through the sacrificial layer and the protection layer.

28. The method according to claim 27, wherein the multiple sidewall spacers comprise an insulating layer formed without using an oxidation gas.

29. The method according to claim 28, wherein the multiple sidewall spacers are formed from a silicon nitride layer, a silicon oxynitride layer, a silicon oxide layer, and/or a metal oxide layer.

30. The method according to claim 28, wherein the multiple sidewall spacers are formed by sequentially forming a silicon oxynitride layer and a silicon nitride layer on the sidewalls of the sacrificial layer and the protection layer.

31. The method according to claim 19, wherein the conductive layer comprises a titanium aluminum nitride layer and/or a titanium nitride layer.

32. The method according to claim 19, wherein removing portions of the conductive layer and the sacrificial layer comprises dry etching.

33. The method according to claim 32, wherein the dry etching comprises isotropic etching using a plasma.

34. The method according to claim 33, further comprising ashing a polymer residue on the protection layer.

35. The method according to claim 19, wherein removing protruding portions of the conductive plug and the sidewall spacer comprises chemical mechanical polishing (CMP) and/or an etch-back process.

36. The method according to claim 19, wherein forming a phase-change data storage element comprises:

forming a phase-change material layer on the contact plug; and patterning the phase-change material layer to form a phase-change material pattern contacting the contact plug.

37. The method according to claim 36, wherein the phase-change material layer comprises a chalcogenide layer.

38. The method according to claim 37, wherein the chalcogenide layer comprises a compound layer containing germanium, stibium, and tellurium.

39. The method according to claim 19, wherein forming a data storage element comprise:

sequentially forming a phase-change material layer and an upper electrode layer on the contact plug;

patterning the upper electrode layer and the phase-change material layer to form a phase-change material pattern contacting the contact plugs and an upper electrode on the phase-change material pattern.

40. The method according to claim 39, wherein the phase-change material layer comprises a chalcogenide layer, and wherein the upper electrode layer comprises a titanium nitride layer.

41. The method according to claim 19, further comprising:

forming an upper interlayer insulating layer on the data storage element; and forming a plate line electrically connected to the data storage element on the upper insulating layer.

42. The method of claim 1:

wherein removing portions of the conductive layer and the sacrificial layer to expose the protection layer and form a conductive plug with the sidewall spacer thereon protruding from the protection layer comprises etching the conductive layer and the sacrificial layer without polishing to expose the protection layer and form the conductive plug with the sidewall spacer thereon protruding from the protection layer; and wherein removing protruding portions of the conductive plug and the sidewall spacer to leave a contact plug in the protection layer comprises polishing to remove the protruding portions of the conductive plug and the sidewall spacer.

43. The method of claim 19:

wherein removing portions of the conductive layer and the sacrificial layer to expose the protection layer and form a conductive plug with the sidewall spacer thereon that protrudes from the protection layer comprises etching the conductive layer and the sacrificial layer without polishing to expose the protection layer and form the conductive plug with the sidewall spacer thereon that protrudes from the protection layer; and wherein removing protruding portions of the conductive plug and the sidewall spacer to leave a contact plug in the protection layer comprises polishing to remove the protruding portions of the conductive plug and the sidewall spacer.

* * * * *